United States Patent [19]

Pauly

[11] 4,241,417
[45] Dec. 23, 1980

[54] CIRCUITRY FOR OPERATING READ-ONLY MEMORIES INTERROGATED WITH STATIC BINARY ADDRESSES WITHIN A TWO-CHANNEL SAFETY SWITCH MECHANISM HAVING ANTI-VALENCY SIGNAL PROCESSING

[75] Inventor: Alexander Pauly, Koenigslutter, Fed. Rep. of Germany

[73] Assignee: Siemens Aktiengesellschaft, Berlin & Munich, Fed. Rep. of Germany

[21] Appl. No.: 836,098

[22] Filed: Sep. 23, 1977

Related U.S. Application Data

[63] Continuation of Ser. No. 681,513, Apr. 29, 1976, abandoned.

[30] Foreign Application Priority Data

May 13, 1975 [DE] Fed. Rep. of Germany ....... 2521245

[51] Int. Cl.³ .................. G06F 11/08; G06F 11/18; G11C 17/00
[52] U.S. Cl. ........................................ 364/900; 371/68
[58] Field of Search ............... 340/172.5; 445/1; 235/153 AE, 153 AH, 304, 304.1, 304.2, 306, 307; 364/900 MS File, 200 MS File; 307/238; 371/68

[56] References Cited

U.S. PATENT DOCUMENTS

| | | | |
|---|---|---|---|
| 2,861,744 | 11/1958 | Schmitt et al. | 235/153 AH X |
| 3,199,077 | 8/1965 | Prather | 235/153 AH X |
| 3,252,149 | 5/1966 | Weida et al. | 235/153 AE |
| 3,303,474 | 2/1967 | Moore et al. | 340/172.5 |
| 3,444,528 | 5/1969 | Lovell et al. | 340/172.5 |
| 3,471,686 | 10/1969 | Connell | 235/153 AE |
| 3,517,174 | 6/1970 | Ossfeldt | 235/153 AE |
| 3,576,982 | 5/1971 | Duke | 235/153 AH |
| 3,624,372 | 11/1971 | Philip et al. | 235/153 AE |
| 3,864,670 | 2/1975 | Inoue et al. | 340/172.5 |

OTHER PUBLICATIONS

Chao, Stanley K. "System Organization of Mobidic B" in *1959 Proceedings of the Gastern Joint Computer Conference*, 1959, pp. 101–107.

*Primary Examiner*—Melvin B. Chapnick
*Attorney, Agent, or Firm*—Hill, Van Santen, Steadman, Chiara & Simpson

[57] ABSTRACT

In a special safety switch mechanism several processing units are arranged in pairs and form an original processing channel and a synchronously operated complementary processing channel which are operated dynamically and alternately in positive and negative logic, in successive processing steps, while using rectangular signal voltages of a given frequency at 180° phase shift for the two logical values ZERO and ONE of the switching variables. During an operation, the signal anti-valency applied to the processing channels is continuously examined. In each processing channel, two-read-only memories are provided for storing fixed values in the form of original and complementary information which are alternately and in successive processing steps connected with the safety switch mechanism for information output.

6 Claims, 16 Drawing Figures

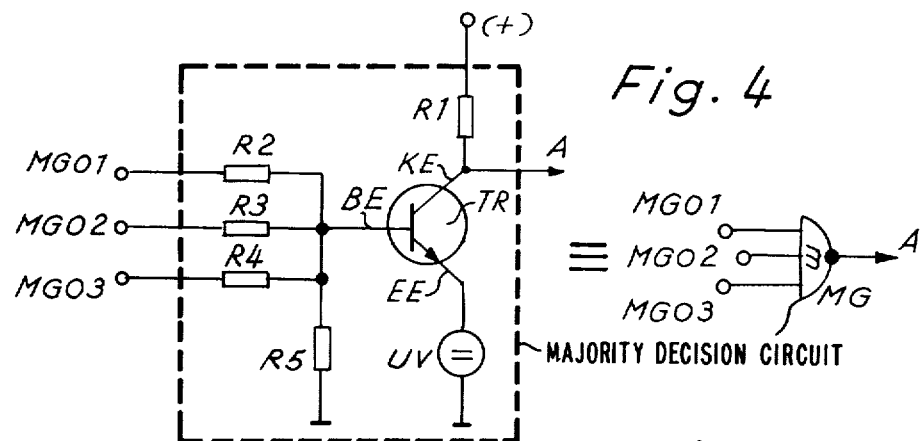
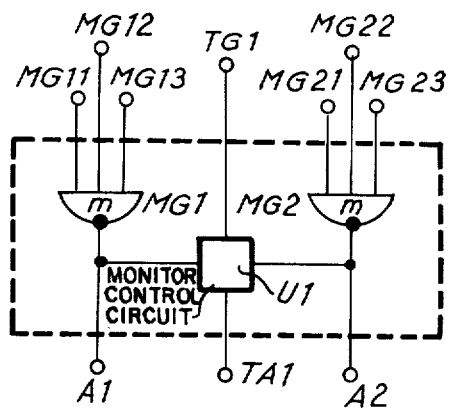
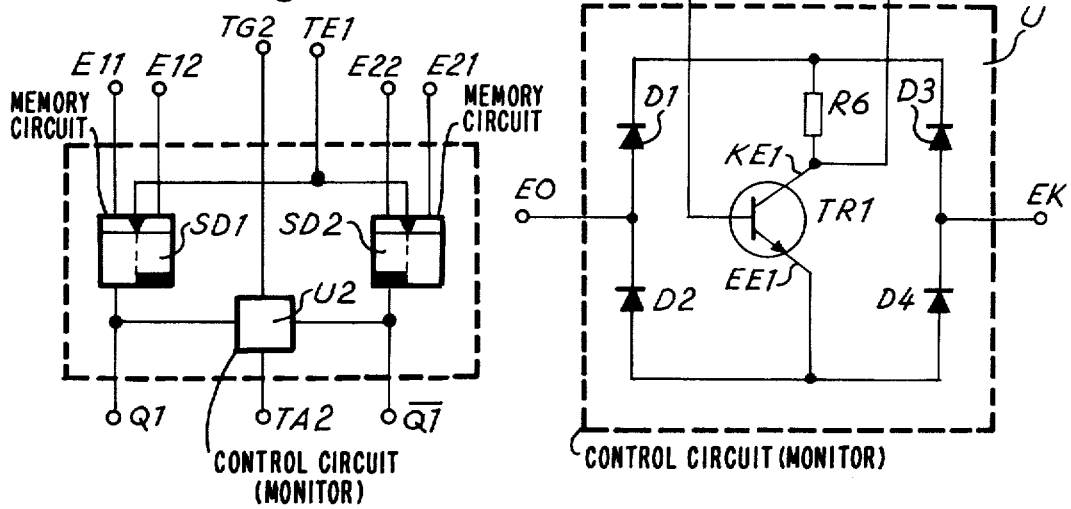

CIRCUITRY FOR OPERATING READ-ONLY MEMORIES INTERROGATED WITH STATIC BINARY ADDRESSES WITHIN A TWO-CHANNEL SAFETY SWITCH MECHANISM HAVING ANTI-VALENCY SIGNAL PROCESSING

This is a continuation of application Ser. No. 681,513, filed Apr. 29, 1976, now abandoned.

BACKGROUND OF THE INVENTION

1. Field of the Invention

This invention relates to a circuit arrangement for the operation of read-only memories, which memories can be interrogated with the help of static binary addresses, within a safety switch mechanism whose processing units are provided in pairs and form an original processing channel and a synchronously operating complementary processing channel. More particularly the invention relates to such an arrangement wherein the processing units are dynamically operated in successive processing steps, alternately in positive and negative logic, while using rectangular signal voltages of a given frequency with a 180° phase shift for the two logical values ZERO and ONE of the switching a control circuit for testing the anti-valency of the output signals is connected to comparable outputs of each pair of processing units, and the binary numbers of dynamic original and complementary addresses consist of a given number of the values ZERO and ONE.

2. Description of the Prior Art

Special requirements are given in various fields of modern data processing techniques, in particular in the sense of cybernetics, with respect to safe processing of the given data. This is true, for example, in the case of railroad safety technology, reactor control, and many chemical processes, as well as air travel safety.

The systems for the construction of switching mechanisms, which may be considered in these fields of technology and which comply with the high safety requirements, are to have a fail-safe behavior, since data processing is only guaranteed for a long period of time if special safety principles are present, whereby faults which endanger the operation may not even occur. In this case of electronic systems which are presently available on the market, a difference is made between such systems which operate in accordance with the mentioned fail-safe principle and such systems which deviate from this principle, but which immediately and automatically cause a message in the case of a fault. It is therefore possible to produce a state without an unsafe operation in the respective switch mechanism without a dangerous time loss.

In the case of a prior art safety circuit for producing logical linkages and guaranteeing a high fault safety, the individual logic linkage circuits are not produced in accordance with the fail-safe principle.

In the case of this safety circuit, the individual processing units are provided in pairs and form an original processing channel and a synchronously operated complementary processing channel. Thereby, both the original processing channel and the complementary processing channel contain a special linkage circuit per processing unit, respectively, whereby the two channels carry anti-valency signals in the case of fault-free operation. It is thereby essential that the anti-valency condition is controlled independently of the data flow, which provides that the safety of a fault recognition is not dependent on the general switch state of the safety switch mechanism. It is furthermore an important feature of the prior art safety circuit that rectangular voltages of a given frequency and amplitude are used as switching variables, whereby the two values ZERO and ONE of the switching variables differ through a phase shift of 180°. Therefore, dynamic signals are present upon the original processing channel and the complementary processing channel of the safety switch mechanism, independent of the respective value of the switching variables upon the respective channel. Due to the particularity of the safety circuit and the applied linkage circuit in the form of majority decision circuit, the processing units in both processing channels have an alternate effect in positive and negative logic, in the case of a dynamic operation. Further individual features of this safety circuit will later be explained in connection with other prior art processing units and component groups for a better introduction and understanding of the subject of the instant invention with the help of several examples.

Furthermore, an electronic memory for digital data processing systems having high fault safety is known in the art which, in view of its conception and of its design, may be applied in connection with the above-mentioned safety circuit for carrying out logical linkages. For a better understanding, the prior art individual features will be explained below in the introductory portion of the Description of the Preferred Embodiments.

SUMMARY OF THE INVENTION

The present invention is based on the object of providing a circuit arrangement for the operation of read-only memories of the above-mentioned kind, to be interrogated by way of static binary addresses, within a safety switch mechanism, whereby static signals are not used as switching variables, but rectangular signal voltages of given frequency having 180° phase shift for the two logical values ZERO and ONE of the switching variables.

I have preceded from the fact that the safety switch mechanism makes dynamic addresses available in the original and in the complementary processing channel, for interrogating stored information, whereby their binary numbers consist of a given number of values ZERO and ONE. The information interrogation is to be made possible without a previous conversion of these dynamic addresses into corresponding static addresses.

Furthermore, it is another object of the invention that the safety level which can be obtained with the initially-mentioned components is even obtained when additional read only memories of the above kind are used in the safety switch mechanism. Faulty functions and component failures are to be recognized and registered with as little delay as possible.

In order to obtain a safety switch mechanism with safe fault recognition, it is to be attempted, even in view of the application of read-only memories, to obtain a two-channel design with these processing units, whereby it is also desired to work with anti-valency signals in the original and in the complementary processing channels.

In accordance with the invention, the above object is achieved in such a manner that two read-only memories are provided in each processing channel as a processing unit for storing fixed values in the form of original or complementary information, respectively, whereby these are alternately connected with the safety switch mechanism in successive processing steps, for an information output.

According to the present invention, an assignment is made in such a way that the dynamic address interrogates a first read-only memory in positive logic, respectively associated with a processing channel, in the case of all processing steps, while the same address is used for interrogating a second read-only memory in processing steps in negative logic. It is thereby essential that original information is stored at an original address in the first read-only memory and complementary information is stored at a complementary address in the second read-only memory. Since the two read-only memories with respect to one and the same processing channel, emit stored original or complementary information, respectively, alternately and in successive processing steps in the case of positive or negative logic, respectively, these items of information are always put into a gap-free succession. The desired information is dynamically available at the output side of each of the two processing channels, in the form of rectangular signal voltages, without requiring that the read-only memory, which is common on the market, need a special change in any manner, in view of the special signal voltages, in order to represent the switching variables ZERO and ONE.

Not only the address inputs of the read-only memories on the market are adapted to the existing safety switch mechanism with the help of the circuit arrangement of the present invention, but the data outputs are also adapted in a simple manner. The redundance as compared with the pair-wise provided processing units in the form of storage circuits or logic linkage circuits is increased over the factor two with the help of the present invention.

An advantageous embodiment of the invention is characterized in that the processing unit in the original processing channel comprises a first read-only memory and a second read-only memory. The second read-only memory contains original information stored at static original addresses, and the first read only memory contains stored complementary information at static complementary addresses. Two equal status address inputs of the memories are connected with a terminal containing the associated binary number of the dynamic original address, respectively by way of a switch system which is connected with the first read-only memory and switches the individual binary numbers of the dynamic original address through only in the case of a negative logic under the control of a signal voltage associated with one of the switching variables, in order to interrogate complementary information. The switch system connected with the second read-only memory and controlled by the signal voltage associated with the other switching variable switches through the individual binary numbers of the dynamic original address only in the case of a positive logic, in order to interrogate original information. The processing unit in the complementary processing channel comprises a third read-only memory and a fourth read-only memory of which the third read-only memory contains original information stored at static original addresses and a fourth read-only memory contains complementary information stored at static complementary addresses. Two equal status address inputs of the two last-mentioned read-only memories are connected with a terminal containing the associated binary number of the dynamic complementary address, via a further switching device. The switch system connected with the third read-only memory switches through the individual binary numbers of the dynamic complementary address only in the case of negative logic, controlled by the signal voltage associated with one of the switching variables, in order to interrogate original information. The switching system connected with the fourth read-only memory, controlled by the signal voltage associated with the other switching variable, switches through the individual binary numbers of the dynamic complementary address only in the case of a positive logic, in order to interrogate the complementary information. An additional switching unit, controlled by the signal voltage associated with one of the switching variables, is connected in the original processing channel to equal status outputs for one binary position, respectively, of the information which is to be emitted by the first and second read-only memories. This additional switch unit connects the respective output of the second read-only memory with an output line in the case of a positive logic, and in the case of a negative logic, the respective output of the first read-only memory is connected to the output line. A further switch system, controlled by the signal voltage associated with the other switching variable, is connected to equal status outputs in the complementary processing channel, for one binary position of the information to be emitted by the third and fourth read-only memories, respectively. This further switch system connects the respective output of the third read-only memory with another output line, in the case of a negative logic, and in the case of a positive logic, the associated output of the fourth read-only memory is connected to the output line. Equal status outputs of the first and third read-only memory are respectively connected with a control circuit, and equal status outputs of the second and fourth read-only memories are also connected with a control circuit, respectively.

Such a circuit arrangement does not only have the advantage that read-only memories which can be interrogated by static binary addresses which are common on the market can be placed into the safety switch mechanism, but that the read-only memories, corresponding to the remaining components of the switching mechanism, also operate within an original processing channel and within a complementary channel, with a continuous control of the emitted output signals with respect to anti-valency. In this manner, the problem of the failure discovery is solved in a simple manner since the possible failures always become noticeable as data falsification, and thus cause an anti-valency interference.

The above will be reviewed and the invention dealt with in greater detail below in the Description of the Preferred Embodiments.

BRIEF DESCRIPTION OF THE DRAWINGS

Other objects, features and advantages of the invention, its organization, construction and operation, and its relationship to the prior art, will be best understood from the following detailed description of preferred embodiments of the invention, taken in conjunction with the accompanying drawings, on which:

FIG. 4 is a schematic representation of a circuit arrangement for carrying out a majority decision of three variables for use as a logic linkage circuit, in a discrete circuit on the one hand, and as the majority decision symbol on the other hand;

FIG. 5 is a truth table for the circuit arrangement illustrated in FIG. 4;

FIG. 6 is a schematic logic diagram of a two-channel component having two linkage circuits in the form of majority decision circuits and having a control circuit associated with these two processing units;

FIG. 7 is a schematic logic diagram illustrating a two-channel component having a memory circuit in the original processing channel and in the complementary processing channel, respectively, and comprising a control circuit associated with the two memory circuits;

FIG. 8 is a schematic circuit diagram of a control circuit for use in a circuit constructed in accordance with FIG. 7;

DESCRIPTION OF THE PREFERRED EMBODIMENTS

Introduction to the Art

Figure 1:
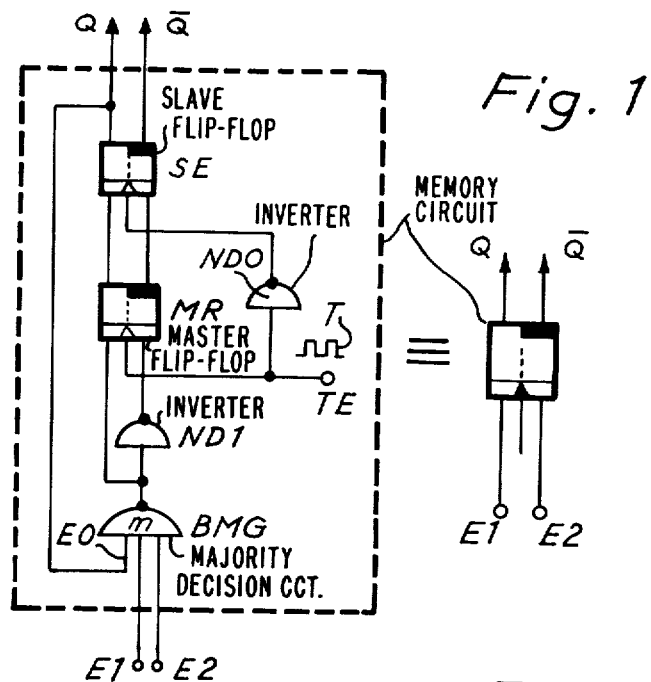
FIG. 1 is a schematic logic diagram of a dynamic memory member which is composed of a RS master-slave flip-flop with a feedback branch by way of a majority decision circuit.

A circuit arrangement constructed in accordance with FIG. 1 illustrates the prior art electronic memory circuit for switching variables in the form of rectangular signal voltages of given frequency having a 180° phase shift for the true logical values ZERO and ONE of the switching variables. The respective information content of the signal voltage present upon a line may be obtained by way of comparing the signal with given reference signals which will be explained later on. An individual representation of the elements required for this circuit member is provided in the left portion of FIG. 1, along with prior art symbols. A symbol for the entire memory circuit which has been simplified for the exemplary embodiments, is illustrated in the right-hand portion of the arrangement illustrated in FIG. 1 and has properties which fulfill the subsequently stated truth tables, as well as Boole's equation $$Qt1 = E1 \cdot E2 + Qto \cdot (E1 + E2).$$

The equation and the truth table are exclusively true for the rectangular dynamic signal voltages. The truth table is as follows.

| E1 | E2 | Qto | Qt1 |
|---|---|---|---|
| L | O | O | O |
| L | L | O | L |
| O | L | L | L |
| O | O | L | O |
| L | O | L | L |
| L | L | L | L |
| O | L | O | O |
| O | O | O | O |

The memory circuit illustrated in the left portion of FIG. 1 essentially consists of a RS master-slave flip-flop, whereby the master is referenced MR and the slave is referenced SE. The timing signals T which are required for the control of the master MR and the slave SE, respectively, are directly supplied to the master MR by way of a timing input TE and indirectly to the following slave SE, by way of an inverter NDO. The signal input into the RS master-slave flip-flop is not as usual effected directly by way of the master MR, but by way of a component group BMG connected ahead of the master MR and having three inputs E0, E1 and E2. This component group has the task of carrying out a majority decision of switching variables in the form of rectangular signal voltages which are applied to the three inputs E0, E1 and E2, in connection with an inversion of the output signal. The output signals of the component group BMG are applied directly to the setting input and, by way of a further inverter ND1, to the reset input of the master MR.

The output Q of the memory circuit illustrated in FIG. 1 is connected with the input E0 of the component group BMG, by way of a feedback branch. The other output of the memory circuit is denoted by $\bar{Q}$. The other two inputs E1 and E2 of the component group BMG are provided for the above-mentioned rectangular signal voltages having a 180° phase shift for the two logical values ZERO and ONE of the switching variables, whereby the respective logical value is provided by the phase position of the given signal voltage, as compared with a given rectangular reference voltage.

The memory circuit briefly described above is illustrated as a simple, timing-controlled flip-flop having two inputs E1 and E2, as well as the outputs Q and $\overline{Q}$, and a timing input which has not been referenced, in order to simplify the representation in the case of subsequent examples, as has been done in the right-hand portion of FIG. 1. Since this flip-flop practically operates upon the trailing edge of the timing pulses, the timing input is provided with a marking to this effect.

Figure 2:
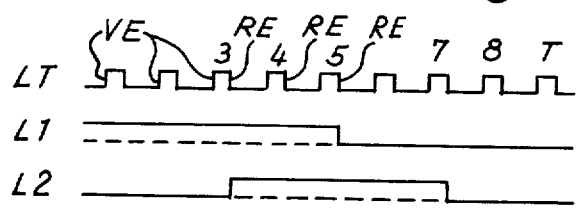
FIG. 2 is a graphic illustration, shown in several diagram lines, of the time path of signal voltages depending on the logical value of the switching variables associated therewith whose respective value is given by the amplitude of the signal voltages.
Figure 3:
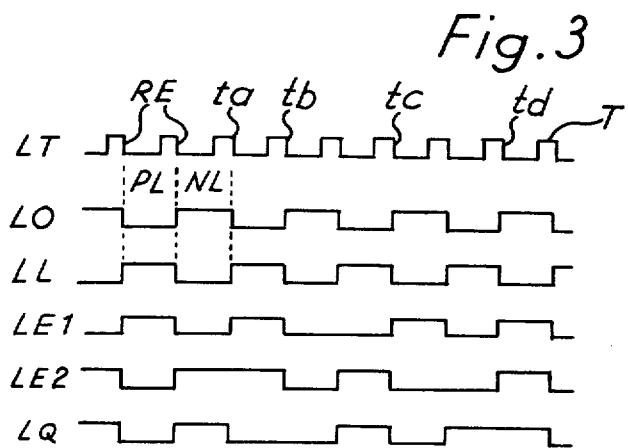
FIG. 3 is a graphic illustration showing, in several diagram lines, rectangular signal voltages for the representation of switching variables whose logical values can be recognized from the respective phase position of the signal voltages with respect to given comparison signals.

FIGS. 2 and 3 illustrate the progression of the timing signals T for the timing input TE of the memory circuit illustrated in FIG. 1, respectively coinciding in the upper diagram line LT. In the case of the respective presence of a leading edge VE of the timing signals T, the master is conditioned corresponding to the signal configuration at its inputs E1 and E2. The basic position both at the master MR and at the slave SE is basically caused when the safety switch mechanism is switched on, by way of a wiring which is not explained in detail, but which is well known to those skilled in the art. When the master MR is set or reset, respectively, the slave SE remains blocked. The signals emitted by the master MR are taken over by the slave SE, respectively, during the next following trailing edge RE of the respective timing signal. During this transit time, the master MR is blocked.

The basic difference between the signal voltages used for the values ZERO and ONE of the switching variables in the case of the present application and the static signal voltages, which are commonly utilized in the art, is to be clearly represented. In digital data processing, a difference is usually made between high and low signal levels of signal voltages in order to represent the logical value "0" or "1" of the switching variables. In the case of the common TTL technique, a fixing in positive logic is made to the effect that a switching variable with the value "0" is represented by a signal voltage of approximately 0 volts. The logical value "1" as opposed to this, is positioned at approximately 3.5 volts. It should also be understood that the term "anti-valency" as used herein refers to signal voltages which, at any instant of time, portray opposite logic levels as viewed in the conventional technique, such as the TTL technique. Identical rectangular voltages which are 180° out of phase therefore constitute anti-valent signals.

The time paths of the signal voltages in the diagram lines L1 and L2 of FIG. 2 are also true for positive logic, so that the diagram line L1 represents the switching variable of the value "1" up to the trailing edge RE of the timing pulse 5 having a high signal level, as seen with respect to time.

The diagram line L2 illustrates the wave of a second signal voltage having another time position of the value "1" of the switching variable, in view of the timing signals of the diagram line LT. The value "1" of the switching variable starts after the trailing edge RE of the timing pulse 3 and stops at the trailing edge of the timing pulse 7. When the signal level is otherwise low, the switching variable of the value "0" will accordingly be provided.

The diagram lines LO, LL, LE1, LE2 and LQ of FIG. 3 represent rectangular dynamic signal voltages having given succession frequencies. The signals in the diagram lines LE1 and LE2 represent the same logical value of the switching variable as the signal paths in the diagram lines L1 and L2 in FIG. 2, respectively, at comparable points in time (referring to the third and fifth timing pulses in each of FIG. 2 and FIG. 3). However, there is an essential difference between the signals of FIGS. 2 and 3 in that the respective values of the switching variables in accordance with FIG. 2 are provided by static signals, while those in accordance with FIG. 3 are provided by dynamic signals. The respective logical value results from the amplitude (FIG. 2) in the case of static signals, and from the respective phase position (FIG. 3) in the case of dynamic signals. The rectangular signal voltages illustrated in the diagram lines LO and LL of FIG. 3 are basically shifted with respect to one another in phase position by 180° and represent the true values ZERO and ONE of the switching variables and serve as reference comparison signals. The second diagram line LO of FIG. 3 thus shows the path and, in particular the phase position of dynamic rectangular signal voltages which are present upon one or more of the inputs E1 and E2 or upon the output Q of the memory circuit illustrated in FIG. 1, respectively, at the value ZERO of the switching variable. The diagram line LL, as opposed to the above, shows the path of the dynamic signal voltage which, due to its phase position, represents the logical value ONE of the switching variable at the inputs E1 and E2 or at the output Q of the memory circuit illustrated in FIG. 1.

A dynamic operating safety switch mechanism which is alternately operated in positive and negative logic, during successive processing steps, will operate in a positive logic when the diagram line LO shows a signal with no potential. This fact is representatively marked with the reference character PL in the diagram line LO, for all corresponding processing steps. As opposed to this, the safety switch mechanism will be in negative logic when the signal voltage, which in the diagram line LO represents the value ZERO of the switching variable, has a high potential. One of these points in time is marked with the reference character NL in the diagram line LO.

In order to promote the understanding of and the handling of preferred dynamic signals in accordance with FIG. 3, in connection with the example of a memory circuit constructed in accordance with FIG. 1, it is first of all assumed that the input E1 of the memory circuit contains a signal voltage whose time path is illustrated in the diagram line LE1. A corresponding assumption then is true for the input E2 of the memory circuit in accordance with FIG. 1, along with the signal voltage associated with this input whose path is shown in the diagram line LE2. The path of the signal at the output Q of the memory circuit illustrated in FIG. 1, which is associated with these two signal voltages or with switching variables representing these voltages, respectively, can be obtained from the diagram line LQ of FIG. 3. The respective memory result Qt1 at the output Q may easily be obtained, while using the above Boolean equation $Qt1 = E1 \cdot E2 + Qto \cdot (E1 + E2)$, for the memory member in FIG. 1, while considering the respective logical values of the switching variables at the inputs E1 and E1, as well as the respective "old" logical state Qto at the output Q.

A comparison of the diagram lines LE1 and LE2 in FIG. 3 with the diagram lines L1 and L2 of FIG. 2, in connection with the timing signals T and the diagram line LT illustrates that the switching variables at the input E1 of the memory circuit of FIG. 1 have the value ONE until the point in time ta which is the trailing edge of the third pulse, and have the value ZERO at the input E2, while the value of the signal at the output Q of the memory circuit also carries the switching variable having the value ZERO. In the above represented truth table for the memory circuit, the term Qto represents that "old" signal state at the output Q of the memory circuit, before the slave SE has taken over the signal configuration present at the input E1 and E2 of the component group BMG. At the trailing edge RE of the respectively following timing signals T a value of the output signals generally denoted by Qt1 in the truth table is valid for the output Q of the memory circuit.

It can be recognized from the diagram line LE2 of FIG. 3 that the switching variable present at the input E2 of the memory circuit changes its value from ZERO to ONE after the point in time ta, since the signal illustrated in the diagram line LE2 is now in phase with that signal shown as the dynamic comparison signal in the diagram line LL. The values of the signal configuration at the inputs E1 and E2, as well as at the output Q, of the memory circuit of FIG. 1 which are assumed in the present operational example are to be obtained from the second line of the truth table to be L, L as well as O for the term Qto. It should be pointed out at this time that, in order to simplify the representations in the truth table, the expressions ZERO and ONE are not used, but the symbols O and L are used instead. However, it remains important that the values ZERO and ONE of the switching variables are represented by dynamic rectangular signal voltages which have a given succession frequency and which are mutually phase shifted over 180°.

After the point in time referenced tb, the trailing edge of the fourth timing pulse, the memory circuit emits a dynamic rectangular signal at the output Q, corresponding to the value ONE of the switching variable after the majority decision and the take-over by the slave SE has been completed. In order to recognize this, the diagram lines LQ and LL of FIG. 3 should be compared after the time tb. It can be recognized that the mentioned signal paths, starting at the time tb, coincide in phase position.

After the timing signal positioned between the times tb and tc, the value of one of the switching variables, and thus the corresponding dynamic signal at the input E1 of the memory circuit in accordance with FIG. 1, has changed from ONE to ZERO, one should compare the diagram line LE1 as well as the third line of the truth table. At the time tc, the trailing edge of the sixth timing pulse, the value of the switching variable ONE will still be provided at the output Q, as the result of the input variable change as can be seen from the diagram line LQ, in connection with the comparison signal in the diagram line LL.

The values O, O of the input variable for the inputs E1 and E2 of the memory circuits in accordance with FIG. 1 which are set forth in the fourth line of the truth table and the value L provided at the output Q are present after the trailing edge of the timing signal positioned between the times tc and td, after the value of the input signal at the input E2 of the memory member has changed, in addition, see the diagram line LE2. Depending on this given configuration of dynamic input signals, the slave SE will emit a dynamic signal by way of the output Q after the transfer of information at the point in time td, corresponding to the value ZERO of the switching variable.

The circuit arrangement illustrated in FIG. 4, in the left-hand portion, shows a preferred embodiment of a circuit for carrying out majority decisions in accordance with the component group BMG in the circuit arrangement of FIG. 1. This circuit has the task of causing a majority decision of three switching variables with output signal inversion and is thus hereinafter called a majority decision circuit, and operates, as will be discussed below, as a linkage circuit in successive processing steps, alternately in positive and negative logic, while using the rectangular signal voltages having a phase shift of 180° for the two logical values ZERO and ONE of the switching variables. The discrete circuit is illustrated in the left portion of FIG. 4, while the right portion of FIG. 4 shows the associated symbol which has been selected in order to simplify the drawing.

The majority decision circuit MG illustrated in FIG. 4 essentially comprises a transistor TR whose collector electrode KE is connected to a positive potential by way of an operational resistor R1. A resistance network of three further resistors R2, R3 and R4 is connected to the base electrode BE of the transistor TR, and have corresponding inputs referenced MGO1, MGO2 and MGO3. Furthermore, the base electrode BE is connected to ground potential by way of a further resistor R5. Due to a voltage source UV, provided as a constant direct voltage source in the emitter circuit of the transistor TR, it is indicated that the emitter electrode EE is connected to a positive potential which is increased so as to be above ground potential. Thus, the transistor TR is safely blocked without a signal at the inputs MGO1–MGO3. The transistor TR will switch only when at least two of its inputs MGO1–MGO3 have electrical signals applied thereto in such a way that the voltage drop at the resistor R5 is greater than the voltage of the voltage source UV plus the threshold voltage between the base electrode BE and the emitter electrode EE of the transistor TR. The result of a majority decision of three signals supplied by way of the inputs MGO1–MGO3 is emitted in inverted form by way of the output A of the majority decision circuit MG.

The truth table set forth in FIG. 5 for the majority decision circuit MG constructed in accordance with FIG. 4 also states the references of the inputs MGO1–MGO3, as well as the output A. It should be pointed out in this connection that the three inputs MGO1–MGO3 of the majority decision circuit MG are entirely equivalent, which should be understandable without difficulties on the basis of the resistance matrix formed by the resistors R2–R4.

The majority decision circuit MG may be operated only with dynamic rectangular signals, as explained in detail in the following discussion, but also with static signals. The symbols O and L shown on the truth table of FIG. 5 of the values of the switching variables refer to the two logical values ZERO and ONE of the switching variables, in the case of the present invention, while using the rectangular signal voltages having the given succession frequency.

It has been assumed in Block 1 of FIG. 5, that, in the case of all four variation possibilities of signals corresponding to the possible values of the switching variables at the inputs MGO2 and MGO3, an input, for example the input MGO1, is steadily charged by a signal corresponding to the switching variable of the value ZERO. A comparison of the values of the switching variables thus provided for the inputs MGO1–MGO3, along with the associated linkage result in the column provided with the reference character A, reveals easily that the majority decision circuit MG, in the case of the operational example considered, operates like a NAND gate due to the constant occupation of one of the inputs MGO1 with the switching variable of the value ZERO. If, as opposed to this, the switching variable with the value ONE is applied to the input MGO1, as illustrated in Block II in FIG. 5, then the values of the switching variables supplied to the remaining inputs MGO2 and MGO3 are linked in accordance with the NOR function. The output signals at the output A illustrate the path represented in the diagram lines LO and LL, respectively in FIG. 3, in the presence of the logical value ZERO or ONE, respectively of the switching variables. It can be recognized with the help of these signal paths that the majority decision circuit MG operates dynamically as a linkage member in successive processing steps, alternately in positive and negative logic, and independent from the respectively emitted value of the switching variable.

FIG. 6 illustrates an arrangement which is provided with a pair of processing units which, in connection with other processing units in a safety switch mechanism, forms an original processing channel, on one hand, and, on the other hand, a synchronously operated complementary processing channel, whereby the processing channels carry anti-valency signals. Two equally designed majority decision circuits MG1 and MG2 having three inputs MG11–MG13 and MG21–MG23, respectively, are provided as the processing units, in accordance with the example illustrated in FIG. 4. A control circuit U1 for testing the anti-valency of the output signals is connected to the two outputs A1 and A2 of the two majority decision circuits MG1 and MG2, and comprises an input TG1 for rectangular testing signals and an output TA1 by way of which the test signals are only emitted in the case of anti-valency of the output signals.

In practice, a safety switch mechanism comprises a multitude of such dual channel processing units each having one control circuit, respectively. These control members are connected in series so that the test signal supplied to a first control circuit and positioned beyond the edge range of the rectangular signal voltages of the switching variables pass through all further control members, as far as the anti-valency condition is fulfilled with all participating processing units of the switch mechanism.

For example, in practice, if the majority decision circuit MG1 is to operate as a NAND gate in the original processing channel, then one of the inputs MG11–MG—, for example the input MG11, is continuously occupied by the rectangular signal voltage which represents the value ZERO of the switching variable. As opposed to this, the majority decision circuit MG2 which, in this case, operates in the complementary processing channel of the safety switch mechanism, is operated as a NOR gate. For this purpose, one of the inputs MG21–MG23, for example the input MG21, will constantly obtain that rectangular signal voltage which is associated with the value ONE of the switching variable. Thereby, the component described in the arrangement in accordance with FIG. 6 represents two linkage circuits which operate alternately in positive and negative logic, during successive processing steps. While the inputs MG12 and MG13 of the majority decision circuit MG1 operating as a NAND gate during positive logic obtain original information in the original processing channel, the inputs MG22 and MG23 of the majority decision circuit MG2 which operates as a NOR gate during positive logic, are occupied by complementary information.

It should still be mentioned as supplementary information that it is possible to permit other logical functions than those of the NAND or NOR function by way of another supply of the original information and/or the complementary information, for example by way of an exchange of inputs in the original processing channel for corresponding inputs in the complementary processing channel or by way of exchanging the two outputs A1 and A2.

The circuit illustrated in FIG. 7 comprises two equal memory members SD1 and SD2, corresponding to the example illustrated in FIG. 1. While, in practice, original information is supplied by way of the inputs E11 and E12 of the memory circuit SD1 in the original processing channel, the memory circuit SD2 in the complementary processing channel obtains complementary information by way of the inputs E21 and E22. The information supplied to the two memory circuits SD1 and SD2 is processed corresponding to the truth tables set forth for the memory circuit. In the original processing channel, the output of the memory circuit SD1 is referenced Q1, and the corresponding anti-valency output in the complementary processing channel is referenced $\bar{Q}1$. A control circuit U2 is also connected to these two outputs Q1 and $\bar{Q}1$, and its input for test signals is referenced TG2. Its output for further processing of the test signals in the case of an existing anti-valency at the outputs Q1 and $\bar{Q}1$ is referenced TA2. The timing inputs of the two memory circuits SD1 and SD2 are collectively fed to a terminal TE1. The representation of the reset inputs for adjusting the circuit to the basic position indicated by the symbols has been left out, as was done in the case of the example illustrated in FIG. 1. Both the twin component constructed in accordance with FIG. 6 and that component constructed in accordance with FIG. 7 are carried out as integrated circuits.

FIG. 8 illustrates a circuit arrangement for an exemplary embodiment of the control member U for controlling the signal anti-valency along comparable lines in the original and complementary processing channels. The control circuit U comprises two input terminals EO and EK which are, in practice, connected with the output lines of the two processing units which are to be controlled positioned in the original processing channel and in the complementary processing channel of a safety switch mechanism, thus for example, with the outputs A1 and A2 of the twin component constructed in accordance with FIG. 6 or with the outputs Q1 and $\bar{Q}1$ of the twin component constructed in accordance with FIG. 7. Furthermore, an input TGO is provided for receiving rectangular test signals, and an output is referenced TAO. The supplied test signals are emitted by way of the last-mentioned output for as long as rectangular signal voltages, for example, are provided at the input terminals EO and EK which are mutually phase-shifted over 180° and thus represent anti-valency of the switching variables. Static signals provide an analogous condition. The circuit of the control circuit U comprises a full-wave rectifier circuit having four diodes D1–D4 whose output voltages serve to supply direct voltage for the switching path of a transistor TR1. The emitter electrode EE1 is directly connected to the rectifier circuit D1–D4, and to the collector electrode KE1 by way of a resistor R6. As long as one of the rectangular signal voltages corresponding to the logical value ZERO of the switching variable (compare diagram line LO in FIG. 3) is present at the input terminal EO, and the other rectangular signal voltage corresponding to the logical value ONE of the switching variables, which is phase shifted by 180°, is present at the other input terminal EK (compare diagram line LL in FIG. 3), or vise-versa, the transistor TR1 will obtain the desired supply voltage. It will then serve to amplify the test signal supplied by way of the input TGO and to further process the signals, in inverted form, by way of the test signal output TAO.

If, due to a defect, the anti-valency condition between the original and complementary processing channels is disturbed relative to the two processing units monitored by the monitoring circuit U, if equivalent rectangular signal voltages are thus applied to the input terminals EO and EK, the signal voltages not being in mutual phase opposition, supply voltage of the transistor TR1 immediately become ZERO. The output of the test signals supplied to the monitoring circuit U is therefore blocked. The absence of the test signals may be analyzed to the extent that, for example, one section or the entire safety switch mechanism is switched off if this step leads to a less dangerous state of the apparatus.

By way of summary, it may be stated that the safety switch mechanism with the above described modules and assemblies operates with a very low safety risk, due to the dynamic mode of operation and a very rapid recognition of defects which is independent of the data flow. With the aid of probability calculation, it was possible to ascertain that a module with two processing units theoretically has a mean safe operating duration of approximately $10^{18}$ years. Even if the total number of $10^6$ two-channel modules, for example, is present in a safety switch mechanism, it is still possible to obtain a mean safe operating duration of approximately $10^{12}$ years. These data are true given a repetition rate of the dynamic signals of 60 kHz.

In a safety switch mechanism in which only some information must be stored, the storage circuit according to FIG. 1 may be advantageously utilized. However, if larger data quantities are to be stored-microprograms or tables, for example, utilizing the cited storage circuits can no longer be economically advocated. This is prohibitive for reasons of space alone.

DETAILED DESCRIPTION OF THE INVENTION

Because of the above-noted desire for increased storage capacity and the space problem encountered in connection with the prior art devices, it is desired that the above-described known arrangements for storing large data quantities in a safety switch mechanism be improved and complemented by a read-only memory for large data quantities, which memory is as conventional as possible.

Conventional read-only memories have the property that their information content cannot be altered during operation once it has been fixed prior to the starting-operation. For this reason, the complicated electronics which is otherwise required for storing data may be eliminated. The read-only memories which have also become known as ROMs and PROMs are the simplest storage arrangements for direct optional access. They consist of a storage matrix, and address decoder, an output amplifiers and hereinafter will simply be called read-only memories as a substantially all inclusive term. A data word consisting of one or more bits which is available on the individual outputs of the output amplifiers during interrogation of a read-only memory is assigned to each input address which, in the case of known read-only memories, always consists of a static binary address, assignment being effected by the storage matrix, independent of its respective technology and the type of address decoder provided therewith. Since conventional read-only memories having fixed assigned address decoders and output amplifiers have been available on the market for several years, and are thus sufficiently familiar to one skilled in the art, any further specific explanation of these known arrangements shall not be made therein.

The present invention, as noted in the introduction above, is based on the object of providing a circuit arrangement for the operation of read-only memories, preferably conventional read-only memories, to be interrogated by way of static binary addresses, within an initially explained safety switch mechanism, whereby static signals are not used as switching variables. Instead rectangular signal voltages of given succession frequency are used which have a 180° phase shift for the two logical functions ZERO and ONE of the switching variables. It is assumed that the safety switch mechanism makes dynamic addresses available in the original and in the complementary processing channels, for interrogating stored information, whereby their binary numbers consists of a given number of values ZERO and ONE. The information interrogation is to be made possible without a previous conversion of the dynamic addresses into corresponding static addresses.

As also pointed out in the introductory portion of this application, another object of the invention is to provide a safety level which can be obtained with the initially-mentioned components when additional read-only memories are used in the safety switch mechanism. Faulty functions and component failures are to be recognized and registered in as short of time as possible.

In order to provide a safety switch mechanism having safe fault recognition, a two-channel design is to be provided with processing units, whereby it is desirable to work with anti-valency signals in the original processing channel and in the complementary processing channel.

In accordance with the present invention, the above object is achieved in such a way that two read-only memories are provided in each processing channel as a processing unit for storing fixed values in the form of original and complementary information, respectively, whereby these memories are alternately connected with the safety switch mechanism in successive processing steps, for information output.

The recognition, in accordance with the present invention, for providing the above, is that an assignment is made in such a way that the dynamic address interrogates a first read-only memory in positive logic, respectively associated with a processing channel, in the case of all processing steps, while the same address is used for interrogating a second read-only memory in all processing steps in negative logic. It is thereby essential that original information is stored at original addresses in the first read-only memory and that complementary information is stored at complementary addresses in the second read-only memory. Since the two read-only memories, with respect to one and the same processing channel, emit stored original information or complementary information, respectively, alternately and in successive processing steps in the case of positive and negative logic, respectively, whereby the bits of this information are always placed into a gap-free succession, the desired information is dynamically available at the output side of each of the two processing channels, in the form of rectangular signal voltages, without a requirement that the read-only memory, which is common on the market, might need a special change in any manner, in view of the special signal voltages, in order to represent the switching variables ZERO and ONE.

It is highly advantageous that not only the address inputs of the read-only memories conventionally available on the market are adapted to the existing safety mechanism with the help of the circuit arrangement constructed in accordance with the present invention, but the data outputs are adapted also in a simple manner. The redundance, as compared with the pairwise provided processing units in the form of storage circuits of linkage circuits, is increased over the factor two with the help of this measure provided by the present invention.

An advantageous embodiment of the present invention is characterized in that the processing unit in the original processing channel comprises a first read-only memory and a second read-only memory. The second read-only memory contains original information stored at static original addresses, and the first read-only memory contains complementary information stored at static complementary addresses. Two equal status address inputs are connected with a terminal containing the associated binary number of the dynamic original address, respectively by way of a switch system, whereby the switch system is connected with the first read-only memory and switches the individual binary numbers of the dynamic original address through only in the case of negative logic, controlled by a signal voltage associated with one of the switch variables, in order to interrogate complementary information. The switch system connected with the second read-only memory, controlled by the signal voltage associated with the other switching variable, switches through the individual binary numbers of the dynamic original address only in the case of positive logic in order to interrogate original information. The processing unit in the complementary processing channel comprises a third read-only memory and a fourth read-only memory. The third read-only memory contains original information stored at static original addresses, and the fourth read-only memory contains complementary information stored at static complementary addresses. Two equal status address inputs of the two last-mentioned read-only memories are connected with a terminal containing the associated binary number of the dynamic complementary address, via a further switch device. The switch system connected with the third read-only memory switches through the individual binary numbers of the dynamic complementary address only in the case of negative logic, controlled by the signal voltage associated with one of the switching variables, in order to interrogate original information. The switch system connected with the fourth read-only memory, controlled by the signal voltage associated with the other switching variable, switches through the individual binary numbers of the dynamic complementary address only in the case of positive logic in order to interrogate the complementary information. An additional switch unit controlled by the signal voltage associated with one of the switching variables is connected in the original processing channel to equal status outputs for one binary position, respectively, of the information which is to be emitted by the first and the second read-only memories, whereby this additional switch unit connects the respective output of the second read-only memory with an output line in the case of positive logic and in the case of negative logic the respective output of the first read-only memory is connected to the output line. A further switch system controlled by the signal voltage associated with the other switching variable is connected to equal status outputs of the complementary processing channel for one binary position of the information to be emitted by the third and fourth read-only memories, whereby this further switch system connects the respective output of the third read-only memory with another output line in the case of negative logic, and in the case of positive logic, the associated output of the fourth read-only memory is connected to the last-mentioned output line. Equal status outputs of the first and third ready-only memories are respectively connected with a control circuit and equal status outputs of the second and fourth read-only memories are also connected with a control circuit, respectively.

A circuit arrangement of the type described above does not only have the advantage that read-only memories which can be interrogated by static binary signals which are common on the market can be placed into the safety switch mechanism, but that the read-only memories, corresponding to the remaining components of the switch mechanism, are also operated in an original processing channel and in a complementary processing channel, with a continuous control of the emitted output signals with respect to anti-valency. In this manner, the problem of failure discovery is solved in a simple manner, since the possible failures always become noticeable as data falsification, and thus cause an anti-valency interference.

During the programming of the read-only memory, the requirement for an anti-valency association of the two channels must already be considered before insertion into the safety switch mechanism in such a way that a read-only memory in the original processing channel obtains original information stored at original addresses, and another read-only memory in the complementary processing channel obtains complementary information stored at complementary addresses.

If it is desired that failure discovery, independent of data flow, is to be made possible in the case of the read-only memories used in the safety switch mechanism, it will be advantageous to provide additional control processes, since the read-only memories, which are commonly available on the market and which are preferably used with the present invention, do not permit, in the first instance, such a data flow-independent failure discovery. These additional control processes must include both the content of the individual memory cells of the read-only memories, as well as the function of the respectively built-in address decoder and the output amplifiers which are included in the read-only memory system.

In the case of the selected read-only memories having selective access, as the same are to be used for the safety switch mechanism, information concerning the content of the individual memory cells can only be obtained by way of address and successively via the respective data output. Therefore, the data flow-independent failure to discovery is only possible when information is emitted by way of the data output and by way of a corresponding interrogation at regular intervals. The desired control process thus becomes independent of data flow when all addresses of the read-only memories are cyclically called.

The further development of the invention is thus based on the object of controlling the read-only memories with the help of the particular switching measures in a data flow-independent manner, without, however, interferring with the normal traffic by way of the read-only memories within the safety switch mechanism.

The solution of the above object proceeds from the recognition that the first read-only memory in the original processing channel and the third read-only memory in the complementary processing channel may be interrogated in respective processing steps in negative logic, from the periphery, while the second read-only memory in the original processing channel and the fourth read-only memory in the complementary processing channel may only be interrogated from the periphery in processing steps in positive logic. This results in the recognition that the first read-only memory in the original processing channel and the third read-only memory in the complementary processing channel may be used in positive logic in all processing steps, and the second read-only memory in the original processing channel, as well as the fourth read-only memory in the complementary processing channel, may be used in all process steps in negative logic, for additional control purposes in view of data flow-independent fault recognition.

The above object is solved in accordance with the above stated recognition, and in accordance with the present invention, in such a manner that a dual counter is provided as an address register and is assigned to the two read-only memories in the original processing channel, in order to provide dynamic original addresses, whereby this counter can be switched further cyclically after two processing steps, respectively, and whereby it respectively connects an input for a binary number with the two equal status address inputs of the first and second read-only memories, by way of the switch systems provided, in such a way that the address generator is respectively connected with the second read-only memory only in processing steps in negative logic and with the read-only memory in processing steps in positive logic. Furthermore, another dual counter is provided as an address generator and is assigned to the two read-only memories in the complementary processing channel in order to provide dynamic complementary addresses, whereby this binary counter can be advanced after two processing steps, respectively, and whereby it connects an output for a binary number with the two equal status address inputs of the third and fourth read-only memories, respectively by way of the switch systems provided at these read-only memories in such a way that this second address generator is respectively connected with the third read-only memory during processing steps in positive logic and with the fourth read-only memory only during processing steps in negative logic.

An advantage of the above measure is provided in that the four read-only memories provided in the two channels for the two processing units are checked for a possible defect cyclically and independent of data flow, whereby the data read in this manner is not subject to interference by the normal operation in the safety switch mechanism. It is particularly advantageous in this connection that no additional control circuits are required for the anti-valency examination, since the control circuits provided for examining the information emitted during the operation may also be used for the test purposes. Furthermore, the advantage is obtained that possible double faults become recognizable on the basis of the above-described arrangement of the safety switch mechanism, in view of the application of read-only memories.

If, however, it is desired to increase the safety conditions even further so that even triple faults may be recognized, whereby even the same information may be falsified in three of four read-only memories without maintaining these faults unrecognized, additional measures must be taken.

The recognition has been made that, in the case of one and the same dynamic original address in the original processing channel, and the corresponding dynamic complementary address in the complementary processing channel, in the case of two successive processing steps with different logic, thus positive and negative logic, it is not only possible to test twice for anti-valency, but such tests may be accomplished four times within the mentioned two processing steps.

Based on this recognition, the safety is even further increased in an advantageous manner in such a way that a control circuit, which can be connected by two switch-over systems only in the case of negative logic, for respectively one output of the first read-only memory in the original processing channel and the equal status output of the fourth read-only memory in the complementary processing channel, whereby the output information of the first read-only memory is respectively guided via a delay circuit which delays the output information over one processing step, and is potential-wise inverted, and that a control circuit which can be connected by way of two further switch systems, also only in the case of negative logic, is respectively provided for an output of the second read-only memory in the original processing channel and the equal status output of the third read-only memory in the complementary processing channel, whereby the output information of the third read-only memory is respectively guided by way of a delay circuit which delays the output information also over one processing step and inverts it, potential-wise, and that the switch-over systems supply the signal voltages of the two switching variables to the associated control circuit in the case of positive logic, respectively.

The particular advantage of the above system is seen in that the given redundance is completely utilized for increasing the safety without requiring additional read-only memories.

In this connection, it is particularly advantageous and useful that the two switch-over systems for the controlled comparison consist of a majority decision circuit having three inputs, respectively, in the case of a differentiation between negative and positive logic, whereby the third input serves as an information input, the second input of one of the majority decision circuits is constantly fed a low potential, and the second input of the other majority decision circuit is constantly fed a high potential, and the first input of one of the majority decision circuits obtains the signal voltage of the variable ZERO or the first input of the other majority decision circuit obtains the signal voltage of the switching variable ONE.

Advantageously, the above results in that the control comparison, in view of an additional safety increase, may be effected with component parts of the safety system which are commonly available on the market.

While considering the succession frequency provided for the rectangular signal voltages, a desired switch circuit may be used as a delay circuit, delaying over half the cycle duration of the succession frequency and effecting an inversion of the output signal with respect to potential.

However, it is particularly advantageous and useful, as well as economic, that the delay circuit comprise a master-slave memory circuit having two inputs E10 and E20 and an output AG which complies with the Boolean equation $$AGtl = E10 \cdot E20 + AGto \cdot (E10 + E20)$$

for the switching variables represented by the rectangular signal voltages, whereby the two inputs serve as information inputs while being interconnected.

In the case of the application of digital, or even analog delay circuits, without a potential inversion of the output signals, it is also possible to carry out the control comparison, but there is the difference that the information of the first read-only memory is respectively compared with the information of the second, or information of the third read-only memory with the information of the fourth read-only memory, respectively.

With the foregoing in mind, the invention will be discussed in detail with reference to FIGS. 9–16.

Figure 9:
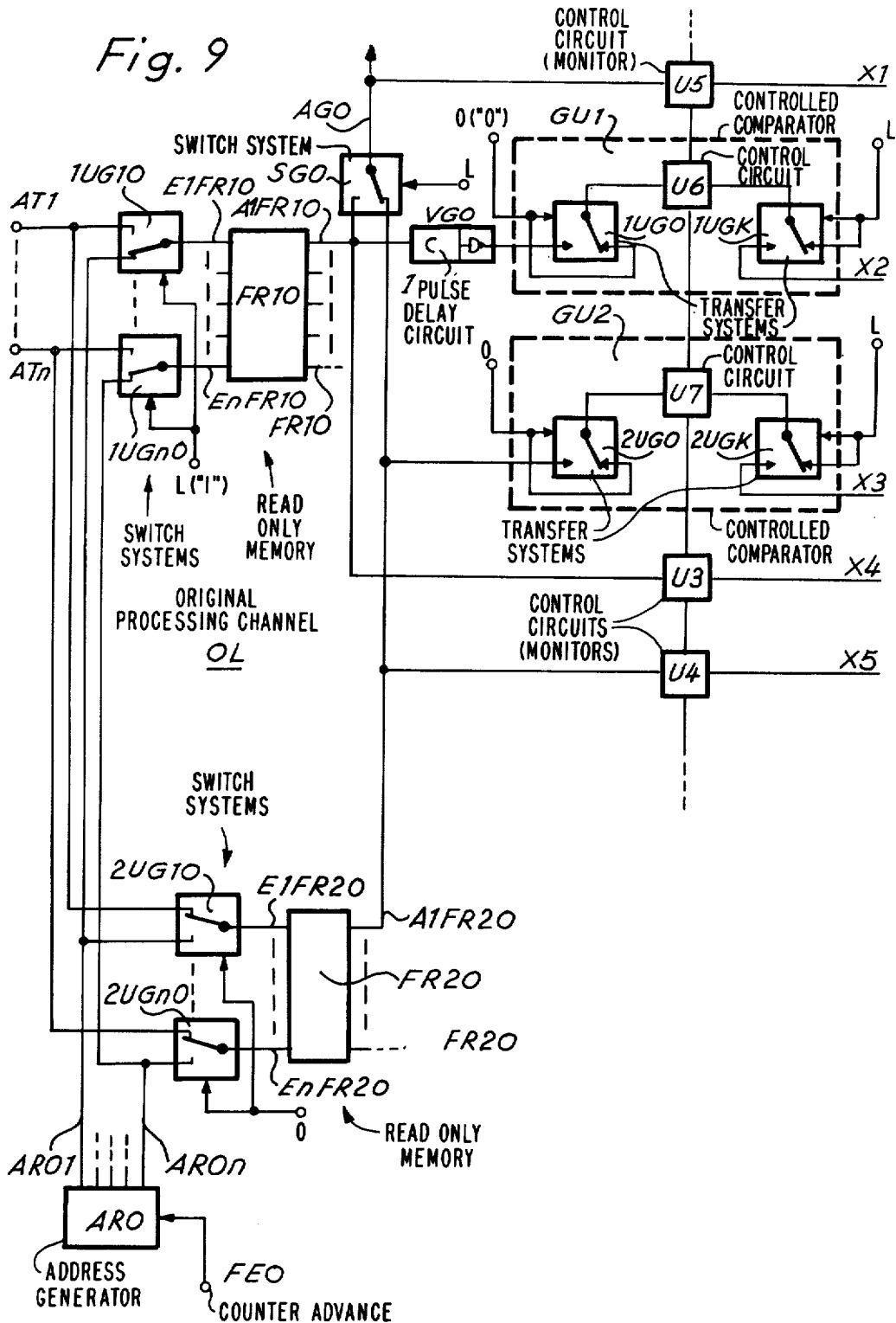
FIG. 9 is a schematic representation of a portion of a safety switch mechanism having a processing unit, respectively, in the original and complementary processing channels, comprising two read-only memories having associated control switch means, respectively, and having comparators associated with the two processing channels, as an embodiment of apparatus constructed in accordance with the invention.
Figure 10:
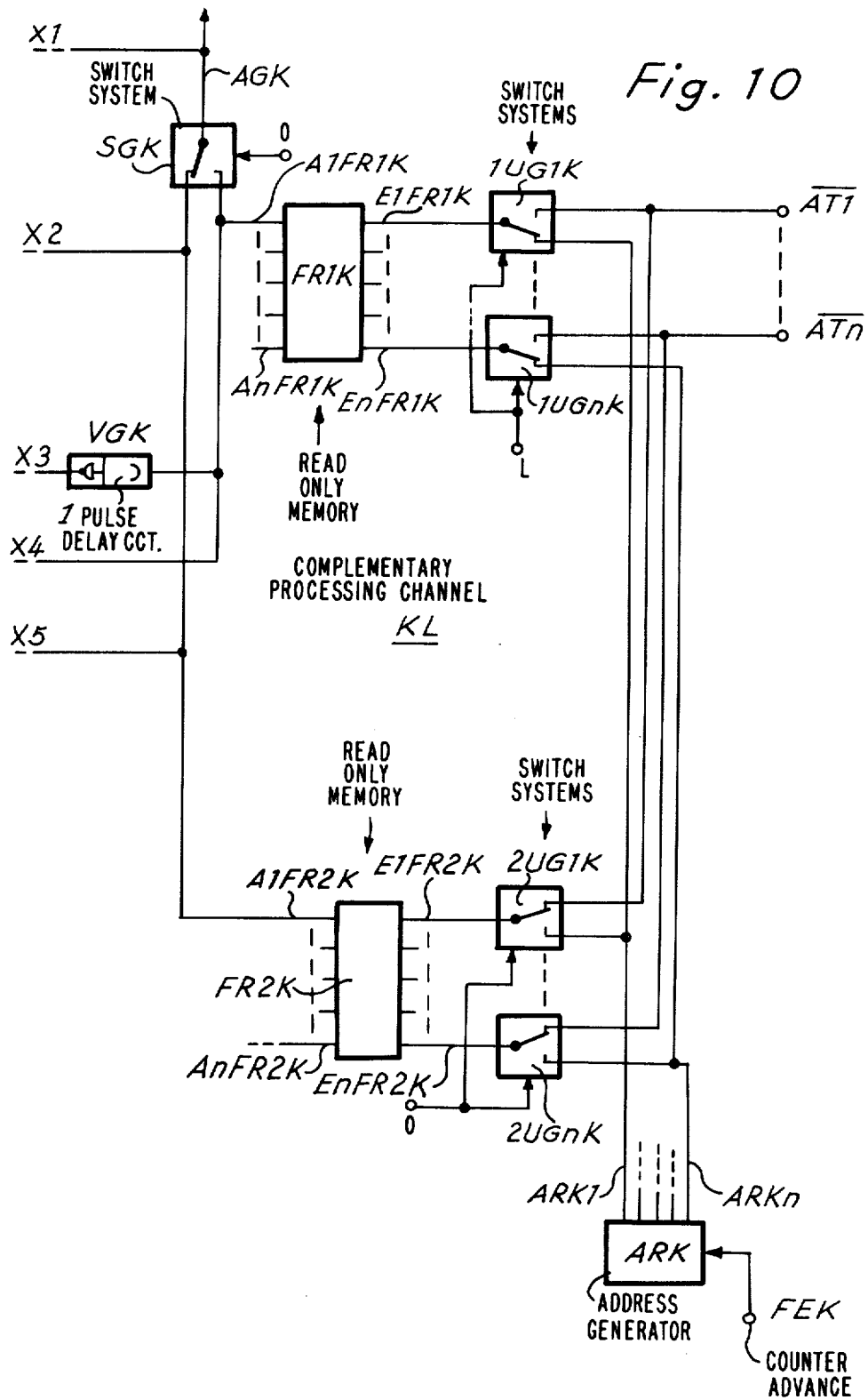
FIG. 10 likewise illustrates another embodiment of the invention showing a portion of a safety switch mechanism having a processing unit in each of the original and complementary processing channels, consisting of two read-only memories having an associated control switch means and comparators associated with the two processing channels.

The circuits represented in FIGS. 9 and 10 show, when combined, a portion of a safety switch mechanism having an original processing channel OL and a synchronously operated complementary processing channel KL. The connection lines between the two halves of the entire circuit of FIGS. 9 and 10 are denoted by the references X1–X5. Due to the two processing channels, the processing units forming the safety switch mechanism are respectively provided in pairs, thus one processing unit in the original processing channel OL and an associated second processing unit in the complementary processing channel KL. Both processing units operate with anti-valency data and in successive processing steps, alternately and with positive and negative logic, while utilizing rectangular signal voltages of a given succession frequency with a 180° phase shift for the two logical values ZERO and ONE of the switching variables. The portion of a safety switch mechanism shown in FIGS. 9 and 10 is concerned with the storage of fixedly provided data in the read-only memories. Thus, the processing unit in the original processing channel OL comprises two read-only memories FR1O and FR2O, while the processing unit in the complementary processing channel KL comprises two read-only memories FR1K and FR2K. Since it is not important for the understanding of the present invention what type of read-only memories are utilized, the technology and design of these component groups is not explained here. For this reason, only a rectangle with a number of inputs and outputs has been employed as a symbol for the read-only memories. It is essential that both the read-only memory FR2O in the original processing channel OL and the read-only memory FR1K in the complementary processing channel contain original information, on the basis of which one data word, respectively, is emitted when a static original address in the form of a binary address is applied to the inputs E1FR2O–EnFR2O in the case of the read-only memory FR2O, or to the inputs E1FR1K–EnFR1K of the read-only memory FR1K, respectively, via the outputs A1FR2O–AnFR2O of the read-only memory FR2O or via the outputs A1FR1K–AnFR1K, respectively. As opposed to this, the read-only memory FR1O in the original processing channel OL and the read-only memory FR2K in the complementary processing channel KL contain complementary information on the basis of which a data word is respectively emitted which is complementary to the data words of the read-only memories FR2O and FR1K, if a static complementary address is applied to the inputs E1FR1O–EnFR1O of the read-only memory FR1O or, respectively, to the inputs E1FR2K–EnFR2K of the other read-only memory FR2K, via the outputs A1FR1O–AnFR1O of the read-only memory FR1O or via the outputs A1FR2K–AnFR2K, respectively. It is a precondition herefore that the mentioned original addresses are of anti-valency with respect to the complementary addresses.

In order to simplify the entire representation of FIGS. 9 and 10, only the outputs of the read-only memory which are associated with the respective first binary position of the data words, which are to be emitted, are connected with further component groups. The respective outputs of the read-only memories FR1O, FR2O, FR1K and FR2K, respectively, carry the reference numerals A1FR1O, A1FR2O, A1FR1K and A1FR2K, respectively. The component groups connected to these outputs and further described and explained with respect to their function hereinbelow are, in practice, present for the remaining outputs of the four read-only memories, in a corresponding number.

An address generator ARO in the form of a dual or binary counter having outputs ARO1–AROn are assigned to the two read-only memories FR1O and FR2O, for test purposes, in the original processing channel OL, for one binary number of a dynamic original address, respectively. It should be particularly pointed out here that a static address always comprises the same high or low potential in the case of successive processing steps for one and the same value of a binary position, while the corresponding dynamic address for one and the same value of a binary position has changing potential in the case of successive processing steps.

An address generator ARK, also in the form of a binary counter, having outputs ARK1–ARKn is also assigned to the two read-only memories FR1K and FR2K in the complementary processing channel KL. This address generator ARK always emits a dynamic address which is complementary to the dynamic original address emitted by the address generator ARO. It is essential for the two address generators ARO and ARK that the emitted addresses are constant in value during two successive processing steps. Counter advance pulses are supplied by way of the terminals FEO and FEK of the two address generators ARO and ARK to advance the latter. Additional details are further explained later on with the help of a block diagram constructed in accordance with FIG. 15 and the associated pulse schedule in accordance with FIG. 16. The addresses which are to be emitted synchronously and cyclically by the two address generators ARO and ARK serve for controlling the four read-only memories FR1O, FR2O, FR1K and FR2K, independently of the operation in the remaining safety switch mechanism. The latter merely provides a dynamic original address in the original processing channel OL, if required, whose binary numbers are supplied by way of the terminals AT1–ATn. Corresponding conditions are also true for the complementary processing channel KL for the dynamic complementary address which is of anti-valency at the same observation instant and which is then provided at the terminals ATl-ATn. Only two inputs, in particular respectively the first and last input, are connected, among the inputs of the four read-only memories FR1O, FR2O, FR1K and FR2K associated with the individual binary positions of the static addresses, in view of a better overall view in reference to the block diagrams of FIGS. 9 and 10. In practice, all inputs are, of course, connected to these associated component groups, as will be explained below. A switch system 1UGlO-1UGnO, 2UGlO-2UGnO, 1UGlK-1UGnK and 2UGlK-2UGnK is respectively connected to each address input ElFR1O-EnFR1O, ElFR2O-EnFR2O, ElFR1K-EnFR1K and ElFR2K--EnFR2K of the four-read-only memories FR1O, FR2O, FR1K and FR2K. These switch systems may, for example, be completely normal electronic switches which are commonly available on the market.

The switch systems have the task of switching through a binary number of the dynamic address offered by the safety switch mechanism or the same binary position of the dynamic address produced by the same processing channel with the help of the respective address generator, onto the associated address inputs during successive processing steps, depending on the respective switch position. The individually selected switch positions are provided when the safety switch mechanism is in positive logic at that time. See the diagram line LO in FIG. 3, with the reference to the reference numeral PL and the associated text provided above. If the safety switch mechanism is in negative logic at another processing step, then the context of the switch systems 1UGlO, 1UGnO, 2UGlO, 2UGnO, 1UGlK, 1UGnK, 2UGlk and 2UGnK are in the other position which is not illustrated.

In order to guarantee a synchronous transfer of the individual switch systems in the case of successive processing steps of the safety switch mechanism, the switch systems are controlled with the help of rectangular signal voltages representing the switching variables, namely the switching systems 1UGlO and 1UGnO in the original processing channel OL and the switch systems 1UGlK and 1UGnK in the complementary processing channel KL by the rectangular signal voltage associated with the value ONE of the switching variables. The switch systems associated with the read-only memories FR2O and FR2K, however, are controlled by the rectangular signal voltage associated with the value ZERO of the switching variables.

Since there exists a rigid phase relation between the mentioned rectangular signal voltages, and both signal voltages have the same succession frequency, the desired synchronous actuation of the switch systems is guaranteed. Since the outputs AlFR1O-AnFR1O, AlFR2O-AnFR2O, respectively, of the read-only memories FR1O and FR2O in the original processing channel OL or the outputs AlFR1K-AnFR1K, AlFR2K-AnFR2K, respectively of the two read-only memories FR1K and FR2K provided in the complementary processing channel KL are not directly connected with the output lines extending into the remaining safety switch mechanism, for example, AGO or AGK, respectively, but are connected respectively by way of the respective processing channel and the respective binary position of the data word to be emitted, such as SGO or SGK, respectively, for the first binary position of the data words, it is guaranteed that data words which are read out on the basis of addresses of the two address generators ARO and ARK are not emitted to the remaining safety switch mechanism. Both the data words read out only for test purposes and the data words requested by the safety switch mechanism are pair-by-pair tested for anti-valency. Therefore, one data word from the original processing channel OL and one data word from the complementary processing channel KL are compared. An anti-valency test is effected in view of the first binary position of each data emitted by the read-only memory FR1O and by the read-only memory FR1K, respectively, with the help of the control circuit U3 which is connected with the output AlFR1O of the read-only memory FR1O and the output AlFR1K of the read-only memory FR1K. The above is valid analogously for the two read-only memories FR2O and FR2K, for the outputs AlFR2O and AlFR2K, in connection with a control circuit U4.

Further control circuits which, however, have not been illustrated on the drawing are correspondingly connected with the remaining outputs of the four read-only memories FR1O and FR1K, FR2O and FR2K, respectively, so that all binary positions of the emitted data words may be tested in view of the desired and assumed anti-valency condition.

The above-mentioned switch systems SGO and SGK thus serve for switching through one binary position, respectively, of the data words requested for the safety switch mechanism. The switch positions as shown again refer to a point in time when the safety switch mechanism is in positive logic. For the synchronous control of the two switch systems SGO and SGK, the first-mentioned rectangular signal voltage associated with the value ONE of the switching variables and the switch system SGK is controlled by the rectangular signal voltages associated with the value ZERO of the switching variables. In this manner, a synchronous operation with the remaining switch systems is provided.

The information provided by way of the output lines AGO and AGK are, in addition, controlled with respect to anti-valency with the help of a control circuit U5. In this manner, the expected function of the switch systems SGO and SGK is tested. Attention is invited that if one of the two switch systems SGO and SGK remains always in the same position due to an interference, information which is no longer anti-valent will reach the control circuit U5 within a very short time. This fault is immediately recognized and registered.

The switch systems SGO and SGK do not only have the task of switching through such information to the remaining safety switch mechanism which had been requested with the help of corresponding addresses, but the mentioned switch systems also fulfill a much more important task which will be explained in the following.

It was initially pointed out that the read-only memories provided for the safety switch mechanism contain only static stored information either in positive or negative logic and can emit this information at a given time. Since, however, the information supplied for the safety switch mechanism, via the output lines AGO and AGK, is not static, but must be represented by the dynamic rectangular signal voltages, another task is added to those of the switch systems SGO and SGK. These static output supplied by the associated read-only memories FR10, FR20 and FR1K, FR2K, respectively, are alternately composed in successive process steps in such a manner that the desired dynamic rectangular signal voltages result for the representation of the respective value ZERO or ONE, respectively, of the switching variables, upon the output lines AGO and AGK.

Since, for example, the same binary position of one and the same data word is stored as original information in the read-only memory FR20 and as complementary information in the read-only memory FR10, the mentioned original information is provided to the switch system SGO in a processing step in positive logic, after the interrogation by way of an original address at the terminals AT1–ATn, for example via the output A1FR20 of the read-only memory FR20 and the switch system SGO, onto the output line AGO, in the form of high potential and, by way of the output A1FR10 of the read-only memory FR10, during the successive process step, in negative logic of the safety switch mechanism in the form of low potentials, whereby the switch system SGO does not thereby have the illustrated switch position. The rectangular dynamic signal voltage upon the output line AGO, which is produced by way of composing static individual potentials, corresponds to the value ONE of the switching variables.

In the case of the same observation for the complementary processing channel KL and a complementary address at the terminals AT1–ATn, it can be determined that, in the case of the processing step in positive logic of the safety switch mechanism, which has been firstly assumed and which is decisive for the switch positions, low potential is emitted toward the switch system SGK, via the output A1FR2K of the read-only memory FR2K, since, presumably, this read-only memory FR2K contains complementary information. In the following processing step, whereby the safety switch mechanism is in negative logic and a switch system SGK is in the position not illustrated, the read-only memory FR1K emits high potential due to the applied dynamic complementary address, via the output A1FR1K, so that a rectangular signal voltage is also produced upon the output line AGK, due to composition of static individual potentials, corresponding to the value ZERO of the switching variable. Therefore, the output lines AGO and AGK carry anti-valency dynamic signals.

IN order to increase the safety, in view of the recognition of triple faults, additional systems in the form of controlled comparators GU1 and GU2, in connection with a particular delay circuit VGO and VGK, respectively, are provided. The two controlled comparators GU1 and GU2 permit a comparison for anti-valency always when the safety switch mechanism is in negative logic in a processing step. The control comparator GU1 respectively compares information which are triggered by the read-only memories FR10 and FR2K, via their outputs A1FR10 and A1FR2K, on the basis of similar, but anti-valency, addresses of the two address generators ARO and ARK. As opposed thereto, the controlled comparator GU2 carries out a comparison of information which is emitted by the output A1FR20 of the read-only memory FR20 and by the output A1FR1K of the read-only memory FR1K, in the case of interrogation with anti-valency addresses of the address generators ARO and ARK. In order to provide the comparable anti-valency information as offered to the controlled comparators GU1 and GU2, respectively, in each second processing step, in particular always in the processing steps of negative logic, the delay circuit VGO has been connected between the output A1FR10 of the read-only memory FR10 and the controlled comparator GU1, and the delay circuit VGO delays the information by a processing step and inverts the potential of the output signal. Due to the double function of the delay circuit VGO, a special symbol was selected for the illustration. A corresponding circuit measure is ture for the output A1FR1K of the read-only memory FR1K and the controlled comparator GU2, in view of the delay circuit VGK.

Each of the two control comparators GU1 and GU2, respectively, contains two transfer systems 1UGO, 1UGK and 2UGO, 2UGK, respectively, as well as a control member U6 or U7, respectively. The transfer systems 1UGO and 2UGO are associated with the original processing channel OL and are controlled by the rectangular signal voltages in order to obtain the required synchronism of the switches, whereby these signal voltages are associated with the value ZERO of the switching variables. The same is analogously true for the transfer system 1UGK and 2UGK which are associated with the complementary processing channel KL, in view of the rectangular signal voltage for the value ONE of the switching variables. The switch positions for the four transfer systems 1UGO, 1UGK, 2UGO and 2UGK, which are shown, are again, as with the entire block diagram, true for one processing step whereby the safety switch mechanism is in positive logic. Thereby, information emitted by the read-only memories is not to be compared since this comparison may generally cause anti-valency interferences due to a mismatch of information which has been requested from the safety switch mechanism due to the previous addresses. In processing steps and positive logic, the two delay circuits VGO and VGK obtain information due to the switch position shown in the drawing and respectively one address of the two address generators ARO and ARK, from the respective read-only memories, whereby this information, due to the delay by one processing step, is still in the successive processing step when the safety switch mechanism is already back in negative logic, whereby this information is available at the associated controlled comparator GU1 or GU2, respectively. In the last-mentioned processing step, when the safety switch mechanism is in negative logic, the same addresses as during the preceding processing step in positive logic are presumably once more emitted by the two address generators ARO and ARK, whereby they are again anti-valent to each other. These addresses interrogate the read-only memory FR2O in the original processing channel OL and the read-only memory FR2K in the complementary processing channel KL. The original and complementary information, respectively, which is thereby emitted by way of the output A1FR2O and A1FR2K, is supplied to the control circuit U7 or U6, respectively, by way of the transfer system 2UGO or 1UGK, respectively, since the mentioned switches are not in the illustrated position in the case of the presumed negative logic. Simultaneously, the two transfer systems 1UGO and 2UGK are also not in the shown position, so that the information offered by the delay circuits VGO and VGK are switched through for the anti-valency test.

It had already been indicated earlier that the controlled comparators GU1 and GU2 are not to compare information in processing steps when the safety switch mechanism is in positive logic, whereby this information would be offered to the associated read-only memories. However, in order to obtain that the control circuits U6 and U7 in the mentioned processing steps in positive logic are still able to carry out a comparison of anti-valency signals, the two rectangular signal voltages corresponding to the two logical values ZERO and ONE of the switching variables are supplied to the control circuits U6, via the associated transfer systems 1UGO and 1UGK. The same is correspondingly true for the control comparator GU2.

Figure 11:
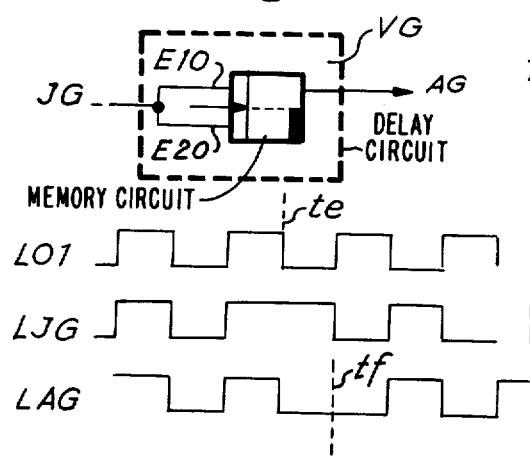
FIG. 11 is a logic diagram of a delay circuit for information delay over a processing step, shown having a potential inversion in connection with a pulse diagram.

FIG. 11 illustrates an exemplary embodiment of a delay circuit VG which can be used in the circuits constructed in accordance with FIGS. 9 and 10 as the delay circuits VGO and VGK, respectively. The delay circuit VG comprises a memory circuit of the type illustrated in FIG. 1 having two inputs E10 and E20 which are interconnected and serve as an information input 1G. The information process onto this information input, in a process step is delayed by exactly one processing step, in view of the output via the output AG, and is inverted with respect to potential.

The three diagram lines LO1, LOIG and LAG having pulse successions are provided to clarify the mode of operation of the delay circuit VG. The diagram line LO1 illustrates the wave of the rectangular signal voltage with a given succession frequency corresponding to the value ZERO of the switching variables. This rectangular signal voltage may serve for fixing the respective value of the switching variables at the information input IG or at the output AG, respectively. The signals provided at the information input IG are illustrated in the diagram line LIG. The corresponding signals of the output AG are illustrated in the diagram line LAG. A comparison of the signals of the diagram lines LO1 and LIG show that at the time te the switching variable of the value ZERO is provided at the information input IG, since the rectangular signal voltages are in phase up to the mentioned time te. After the time te, a phase shift occurs in the diagram line LIG. This illustrates that, from the time tf, the value ONE of the switching variables is provided at the information input IG. Due to the delay property over one processing step, the output AG will emit the switching variable of the value ZERO until the time tf, whereby, due to the potential inversion, the high potential before the time te in the diagram line LIG is associated with the low potential before the time tf in the diagram line LAG. The signal path shown in the diagram line LAG after the time tf (when observed from left to right) corresponds to the value ONE of the switching variables with a potential inversion. This fact can also be clearly recognized in that the same signal path results when the pulse succession of the diagram line LIG is shifted toward the right and inverted from the time te on.

Figure 12:
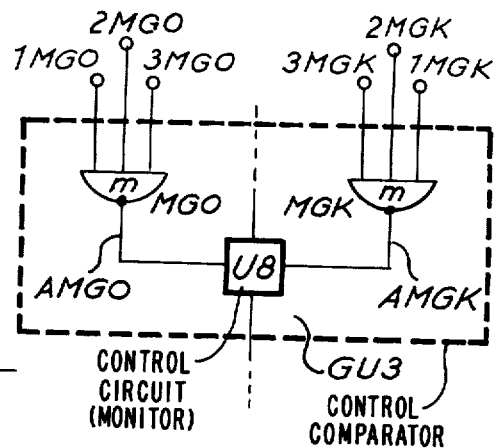
FIG. 12 is a schematic logic diagram of a circuit constructed for a controlled comparison.

The circuit arrangement illustrated in FIG. 12 shows a preferred exemplary embodiment of a control comparator GU3 which can be very advantageously applied in the case of the exemplary embodiment constructed in accordance with FIGS. 9 and 10, since the component parts required for this controlled comparator are provided by a design which is commonly available on the market, corresponding to the explanations with respect to FIG. 6, and thus a particular technical expense is not required for realization of the control comparator.

Individually, the controlled comparator GU3 constructed in accordance with FIG. 12 comprises two majority decision circuits MGO and MGK having three inputs, respectively, 1MGO, 2MGO, 3MGO and 1MGK, 2MGK and 3MGK, respectively. The outputs AMGO and AMGK are connected to a control member U8. The function of the majority decision circuits MGO and MGK has already been explained in detail with the help of FIGS. 4 and 5. The majority decision circuit MGO may operate in the original processing channel OL of FIG. 9 and the other majority decision circuit MGK may operate in the complementary processing channel KL of FIG. 10. While the one majority decision circuit MGO provided for the original processing channel OL obtains the rectangular signal voltage corresponding to the value ZERO of the switching variables, at one of the inputs 1MGO, one of the inputs 1MGK of the majority decision circuit MGK operating in the complementary processing channel KL is charged with that rectangular signal voltage which is associated with the logical value ONE of the switching variables. The second input 2MGO of the majority decision circuit MGO is connected to an electrically low continuous potential, while the corresponding input 2MGK of the majority decision circuit MGK always has a high continuous potential applied thereto. The inputs 3MGO and 3MGK of the two majority decision circuits are reserved for the supply of information from the associated read-only memories. If, for example, the controlled comparator GU3 is to be used instead of the comparator referenced GU1 in the circuit of FIGS. 9 and 10, then the input 3MGO of the majority decision circuit MGO is connected to the output of the delay circuit VGO. The input 1MGK of the majority decision circuit MGK obtains a direct connection with the output A1FR2K of the read-only memory FR2K in the complementary processing channel KL (FIG. 10).

Figure 13:
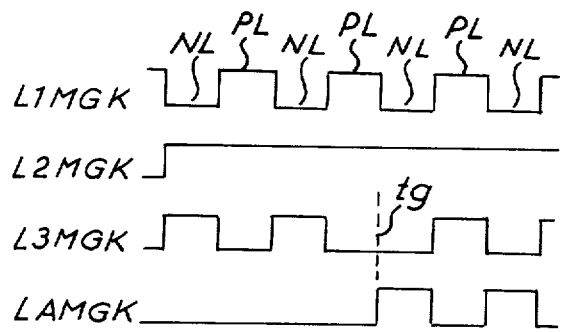
FIG. 13 is a graphic illustration showing, in several diagram lines, pulse successions for explaining the controlled comparison.
Figure 14:
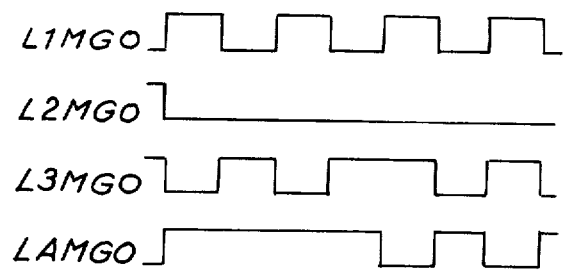
FIG. 14 is also a graphic illustration showing, in several diagram lines, pulse successions for explaining the controlled comparison.

The diagram lines in FIGS. 13 and 14 are provided to explain in greater detail the mode of operation of the control comparator GU3 constructed in accordance with FIG. 12. In order to better clarify the association of the illustrated signals with the respective inputs and outputs, the individual diagram lines are also again provided with such reference numerals which correspond to those reference numerals which correspond to those reference numerals selected for the respective input or output at which the signal shown in the associated diagram line is predominant, prefixed by the letter L.

The reference numerals PL and NL explained already for the diagram line LO in FIG. 3, for process steps when the safety switch mechanism is in positive logic or negative logic, respectively, are also provided above the diagram line in accordance with FIGS. 13 and 14, so that it can be recognized when the control comparator GU3 compares information from the read-only memories in the case of negative logic, whereby this information had been read on the basis of addresses emitted by the two address generators ARO and ARK.

In the case of the comparison of the constant high potential shown in the diagram line L2MGK, with the wave forms of the diagram lines L1MGK of FIG. 13 and the diagram line L1MGO of FIG. 14, it can be seen that the mentioned high potential can be understood to be a steady change of the rectangular signal voltages of a given succession frequency with a 180° phase shift for the two logical values, used for the two values ZERO and ONE of the switching variables. Thus, this means that the signal path shown in the diagram line L2MGK starts in negative logic NL with a signal H, in the first processing step, corresponding to the signal path and thus to the rectangular signal voltage associated with the value ZERO of the switching variables, shown in the diagram line L1MGO of FIG. 14. During the following processing step in positive logic PL of the safety switch mechanism, the signal shown in the diagram line L1MGK then corresponds to the high potential shown in the diagram line L2MGK. Thus, the signal applied to the input 2MGK of the majority decision circuit MGK, at that point in time, can be evaluated as a signal portion of the rectangular signal voltage corresponding to the value ONE of the switching variables.

It can be seen from the diagram line L3MGK that the input 3MGK associated therewith of the majority decision circuit MGK is supplied with information of the value ZERO at the time tg. From the time tg, the value of the switching variable changes and becomes a ONE. Since the input 3MGO, as opposed to the input 3MGK, obtains a signal during the application of the controlled comparator GU3, instead of the control comparator GU1 (FIGS. 9 and 10), whereby this signal is delayed over one processing step and inverted, the signal path illustrated in the diagram line L3MGO is valid for the input 3MGO.

While applying the truth table in accordance with FIG. 5, which is valid for majority circuits, the following succession of values results at the output AMGK of the majority decision circuit MGK, corresponding to the signal path of the diagram line LAMGK, during an individual processing step, from the left to the right:

ONE, ZERO, ONE, ZERO, ZERO, ETC.

Analogously, the same definition holds true for the low potential illustrated in the diagram line L2MGO which is continuously supplied to the input 2MGO of the majority decision circuit MGO in view of the association with the signal paths of the diagram line L1MGO, as was explained for the signal path of the diagram line L2MGK.

In a first processing step, whereby the safety switch mechanism is in negative logic corresponding to the illustrated fixation, the low potential at the input 2MGO may be evaluated as a signal portion of the rectangular signal voltage, corresponding to the value ONE of the switching variables.

In the following processing step, when the safety switch mechanism operates in positive logic, a signal portion of the rectangular signal voltage corresponds to low potential which is associated with the value ZERO of the switching variables.

By way of linking the respective values of the switching variables corresponding to signals present at three of the inputs 1MGO, 2MGO and 3MGO of the majority decision circuit MGO, in the individual processing steps, while using the truth table in accordance with FIG. 5, the signal path illustrated in the diagram line LAMGO results which represents the following values of the switching variables in the individual processing steps, in a succession from left to right:

ZERO, ONE, ZERO, ONE, ETC.

A comparison of the signals processed toward the control circuit U8 by way of the outputs AMGO and AMGK of the two majority decision circuits MGO and MGK shows that the desired signal anti-valency is given in all processing steps.

Figure 15:
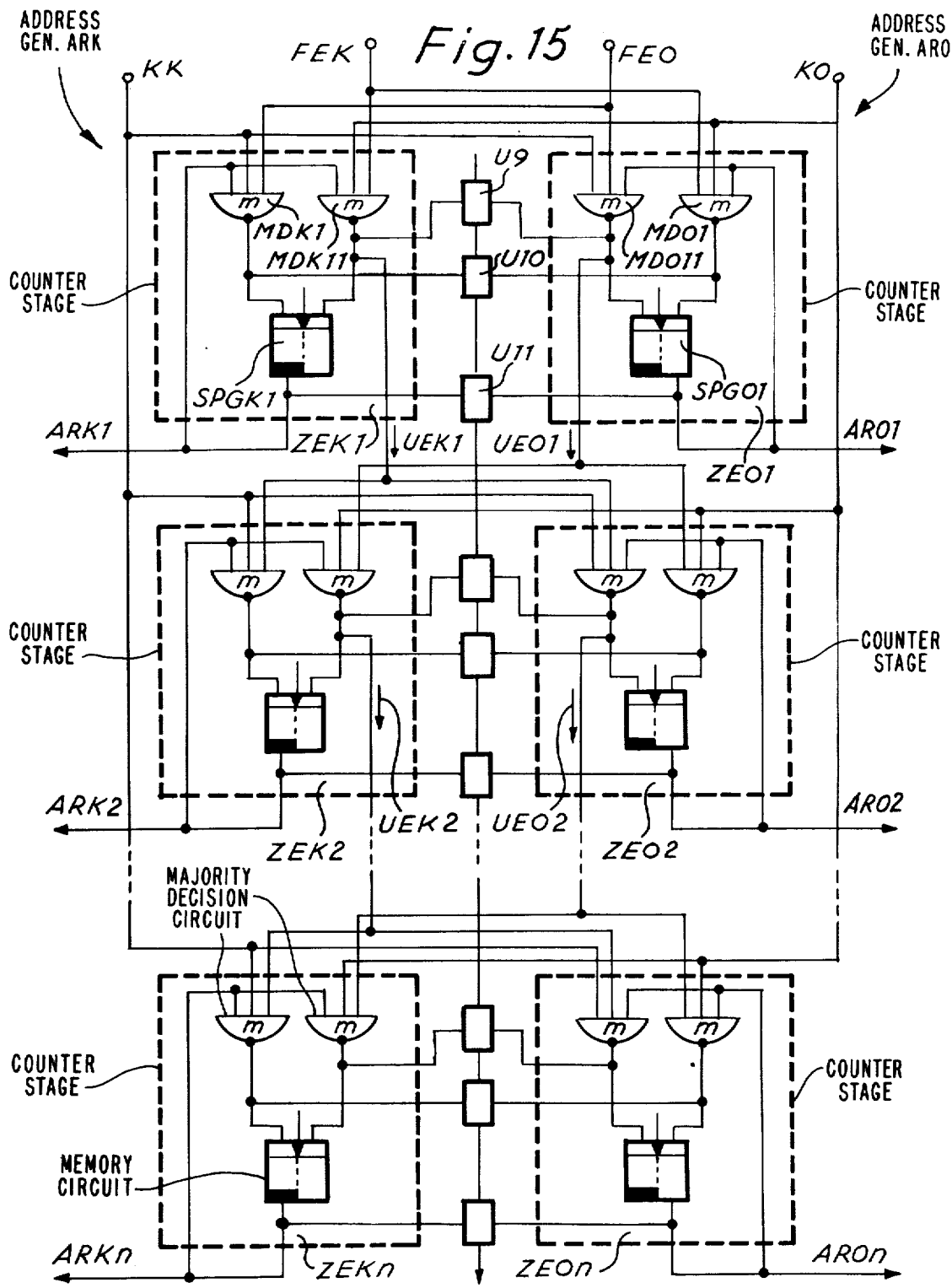
FIG. 15 is a schematic logic diagram of a dual counter as an address generator for dynamic addresses, which can be switched forward after two processing steps, respectively.

FIG. 15 illustrates an exemplary embodiment of the two address generators ARO in the original processing channel OL and ARK in the complementary processing channel KL. Only three counter stages are illustrated for each of the two binary counters, the first two stages and the last stage. It should be pointed out at this time that the circuit arrangement constructed in accordance with FIG. 15 partially utilizes reference numerals which have already been applied for equivalent elements in the arrangement according to FIGS. 9 and 10, with the address generators ARO and ARK, respectively, which were illustrated there.

The counter stages ZEO1, ZEO2-ZEOn belong to the binary counter used in the original processing channel OL as the address generator ARO. The counter stages ZEK1, ZEK2-ZEKn are the corresponding stages of the binary counter which is provided for the address generator ARK in the complementary processing channel KL. Each counter stage, for example the counter stage ZEO1 in the original processing channel OL, comprises a memory circuit SPGK1 and two majority decision circuits MDO1 and MDO11. The same structure is provided for the counter stages of the binary counter in the complementary processing channel KL. As more specifically referenced, the memory in the complementary channel is referenced SPGK1 and the two majority decision circuits are referenced MDK1 and MDK11, respectively.

The function and mode of operation of the switching circuits used for the counter stage has already been explained with the help of FIGS. 1-3, and with the help of FIGS. 4 and 5, in such detail that a further detailed explanation of these circuits is not necessary at this point.

Since, as was explained in detail with the help of FIGS. 6 and 7, twin component parts having two majority decision circuits, respectively, and a control circuit associated therewith, respectively, and twin component parts having two memory circuits, respectively, and one control member associated therewith, respectively, are provided as integrated circuits on the market, a relatively simple design results for the construction of the two complementary counter stages such as ZEO1 and ZEK1 in dynamic technique, whereby only two twin component circuts having majority decision circuits and a twin component circuit having two memory circuits are required. The control circuits provided for the anti-valency control in the two counter stages ZEO1 and ZEK1 are referenced U9, U10, and U11. In the case of the remaining counter stages, the control circuits required have been illustrated, but have not been referenced.

Figure 16:
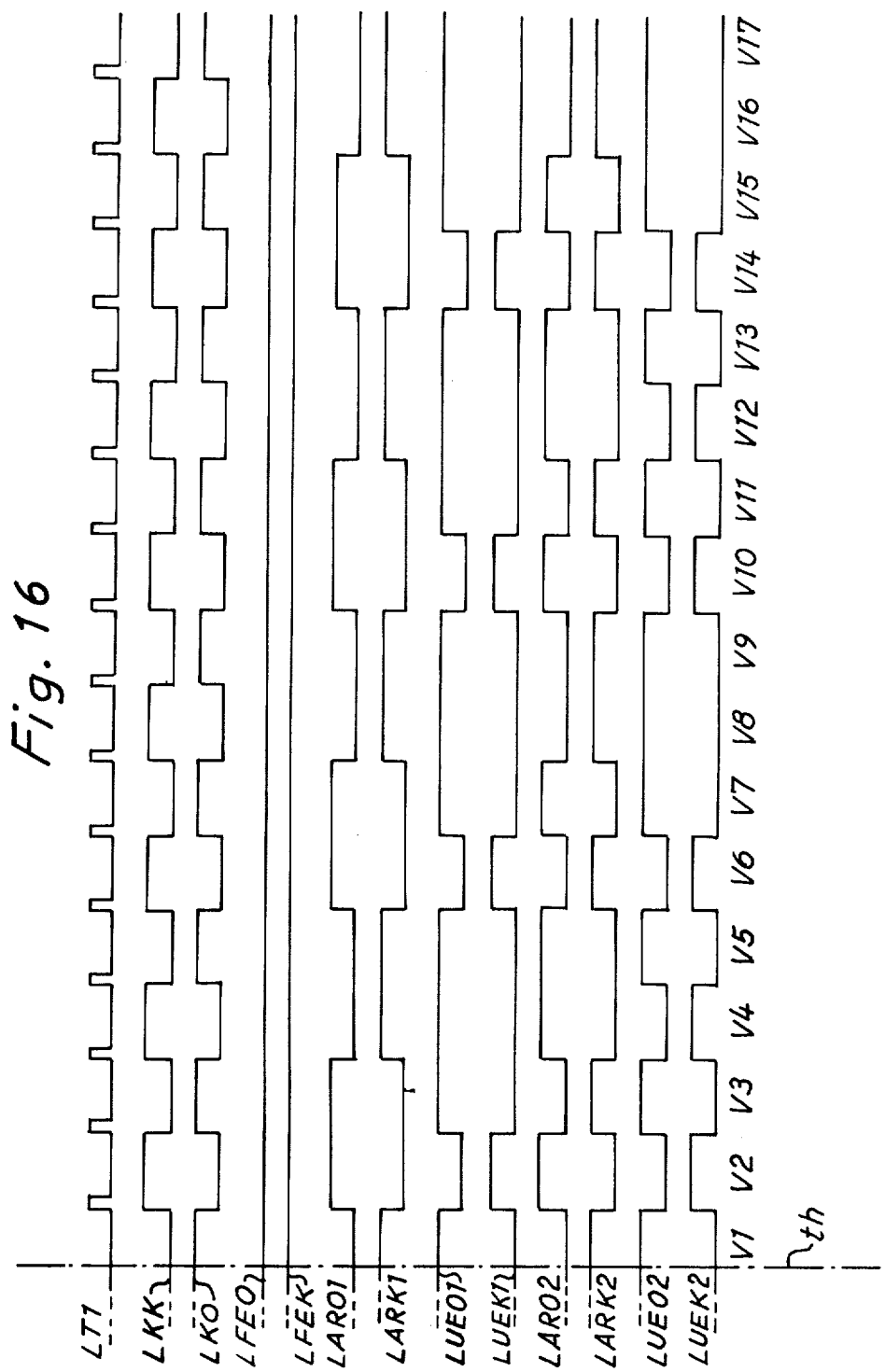
FIG. 16 is a graphic illustration of pulse successions for a further explanation of the address generator in the original and complementary processing channels, shown in several interrelated diagram lines.

In the case of the circuit arrangement constructed in accordance with FIG. 15, the lines for supplying timing pulses, as shown in the diagram line LT1 in FIG. 16, which are required for the operation of the memory circuits SPGO1 and SPGK1, have not been illustrated for the purpose of clarity, it being understood that these lines would be provided to the timing inputs as previously discussed.

As illustrated in the corresponding diagram lines LKO and LKK, the rectangular signal voltage corresponding to the values ONE and ZERO of the switching variables, respectively, are supplied by way of the terminals KO and KK, respectively. The terminals FEO and FEK, after the starting of the entire safety switch, are placed at constantly low or constantly high potential, respectively, as illustrated in the diagram lines LFEO and LFEK in FIG. 16. As has already been described for the diagram lines L2MGK and L3MGO in FIGS. 13 and 14, constant potentials are desired to be a succession of parts of rectangular signal voltages which, in the case of successive processing steps, are alternately associated with the value ZERO and ONE, respectively, of the switching variables. Therefore, the low potential in accordance with the diagram line LFEO, may be considered to be a succession of signals which are alternately associated with the values ZERO or ONE, respectively, of the switching variables. As opposed to this, a succession of the two values of the switching variables resuls for the signal path of the diagram line LFEK starting with the value ONE in the first of the seventeen illustrated processing steps V1-V17.

In the description of the mode of operation of the two binary counters used as address generators, it has been proceeded from their base position which was caused at the time th in FIG. 16. At this time the l outputs ARO1, ARO2 or ARK1, ARK2, respectively, carry the signals illustrated in the diagram lines LARO1, LARO2 or LARK1, LARK2, respectively, of FIG. 16. The diagram lines LUEO1 and LUEK1 illustrate the path of transmission signals UEO1 and UEK1 from the counter stage ZEO1 to the counter stage ZEO2 or from the counter stage ZEK1 to the associated second counter stage ZEK2, respectively. The same holds true for the diagram line LUEO2 and LUEK2, in view of the transfer of the signals UEO2 and UEK2 which had been emitted by the counter stages ZEO2 and ZEK2.

Proceeding from the base position adjusted during the first processing step V1, the memory member SPGO1 in the counter stage ZEO1 supplies a signal corresponding to the value ZERO of the switching variables by 1 way of the output ARO1. This signal is supplied to one of the inputs of the majority decision circuit MDO1, together with signals applied at the terminals KO and FEK. This results in a signal at the output of the majority decision circuit MDO1, which is identical with that present at the terminal FEO, and corresponding to the value ZERO of the switching variables in the first processing step V1.

In the same processing step V1, the output of the majority decision circuit MDO11 carries a signal corresponding to the value ONE. On the basis of the truth table valid for the memory circuits SPGO1 and SPGK1, the memory circuit SPGO1 maintains the previously present value ZERO of the switching variables at its output ARO1, even during the following processing step V2. Thus, the value of the binary position of the address emitted by way of the output ARO1, has as presumed, maintained constant for two successive processing steps.

Then, at the beginning of the processing step V3, the signal applied to the terminal FEO is, seen dynamically, valid as the value ONE, and the signal at the terminal FEK, is to be considered as the value ZERO at the same time, and the output ARO1 of the memory member SPGO1 accepts a signal having the value ONE of the switching variables at the beginning of the third processing step, and thus changes the signal configuration at the outputs of the majority decision circuits MDO1 and MDO11. Thus, the output of the majority decision circuit MDO assumes a signal of the value ZERO, and the other majority decision circuit MDO11 assumes a signal of the value ONE, at its output. Due to the given signal configuration, the memory content of the memory member SPGO1 also does not change during the next processing step V4, and thus maintains an output signal having the value ONE. Only at the beginning of the next processing step V5, when the signal at the terminal FEO assumes the value ONE, seen dynamically, and the signal at the terminal FEK has the value ZERO, as seen dynamically, then the output ARO1 of the memory member SPGO1 will accept the signal with the value ZERO. Thus, the signal configuration again changes at the inputs of the majority decision circuits MDO1 and MDO11 in the counter stage ZEO1 which will cause the described cycle to start anew. With respect hereto, it can be seen from the diagram line LARO1 that the signal present in the processing step V5 is identical with that of the processing step V1. Furthermore, it should be pointed out at this time that the signal emitted by way of the output ARO1, having the value ONE is also again constant for two successive processing steps V3 and V4.

The output of the majority decision circuit MDO11 supplies the signal UEO1 for the subsequent counter stages ZEO2 and ZEK2. This signal UEO1 has the value ZERO only in the processing steps V4, V8, V12 and V16, etc, and the value ONE in the remaining processing steps.

The counter stage ZEK1 operating in the complementary processing channel KE has an analogous behavior with respect to the above described counter stage ZEO1. While the counter stages ZEO1, ZEO-2-ZEOn supply one binary position of the dynamic original address, respectively, for test purposes, the outputs ARK1, ARK2-ARKn of the counter stages ZEK1, ZEK2-ZEKn emit values of the binary positions which form the respective binary dynamic complementary address. For this reason, the diagram line LARK1 illustrates a signal path which is anti-valent with respect to that of the diagram line LARO1. The same is also true for the signals of the diagram lines LARK2 and LARO2, in view of the outputs ARK2 and ARO2 of the two counter stages ZEK2 and ZEO2.

After the adjustment of the basic position of the counters at the time th, the memory circuit SPGK1 supplies a signal of the value ONE at its output ARK1. This will cause the majority decision circuit MDK1 to emit a signal of the value ONE, and the output of the majority decision circuit MDK1 to emit a signal of the value ZERO. Due to the truth table for the memory circuits, the memory member SPGK1 has the output signal of the value ONE also during the processing step V1. If the signal at the terminal FEO is now interpreted as a dynamic signal of the value ONE and the signal at the terminal FEK is interpreted as a dynamic signal of the value ZERO, in the processing step V2, then the output ARK1 of the memory member SPGK1 will accept a signal of the value ZERO at the beginning of the processing step V3. Thus, the signal configuration changes at the two majority decision circuits MDK11 and MDK1. The majority decision circuit MDK1 will emit a signal corresponding to the value ONE at its output. The other majority decision circuit MDK11 supplies a signal of the value ZERO at its output. Due to the existing signal configuration at its inputs, the memory circuit SPGK1 does not yet change the value of its output signal, even in the fourth processing step V4. The output signal with the value ZERO thus remains. In the processing step V4, the signal at the terminal FEO, is seen dynamically and interpreted as the value ONE of the switching variables, and the signal at the terminal FEK is seen dynamically as a signal of the value ZERO. Thus, the output ARK1 of the memory circuit SPGK1 accepts a signal of the value ONE at the beginning of the next processing step. Thus, the signal configuration at the inputs of the two majority decision circuits MDK11 and MDK1 is changed again, so that the described cycle begins anew. The transmitted signal UEK1 is supplied by the output of the majority decision circuit MDK11 in the counter stage ZEK1, and together with the transmitted signal UEO1, controls the circuit connection of the following counter stages ZEO2 and ZEK2 of the two anti-valency operating binary counters in accordance with FIG. 15.

It can be recognized with the help of the diagram lines LARK1 and LARK2 that the counter stages ZEK1 and ZEK2 also emit signals whose values remain constant into successive processing steps.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In an improved apparatus for continuously checking the bit patterns read out from memory units, wherein the apparatus has a first means for transmitting digital information, forming a digital processing channel, and a second means for transmitting digital information, forming a synchronously operated, complementary, digital processing channel wherein all data and addresses transmitted therein are complements of corresponding data and addresses transmitted in the first means for transmitting, at least first and second digital switching means connected respectively to the first and second means for transmitting, the first and second switching means being dynamically operated alternately in positive and negative logic in successive processing steps, by utilizing rectangular signal voltages of a given frequency and with a 180 degree phase shift for the two logic values 0 and 1 to define switching variables, and means for monitoring connected to the first and second digital switching means, the means for monitoring continuously senses the valency or anti-valency of output signals generated by the first and second digital switching means based on data values transmitted from the first and second means for transmitting to the first and second digital switching means, and the means for monitoring generates a predetermined alarm signal upon sensing a valency condition, the improvement comprising:

first, second, third and fourth read-only memory means, wherein
said first and second read-only memory means are connected to the first means for transmitting,
said third and fourth read-only memory means are connected to the second means for transmitting,
said second read-only memory means contains selected data stored at selected addresses,
said first read-only memory means contains data corresponding to the complements of said selected data stored in said second read-only memory means, stored at addresses corresponding to the complements of said addresses in said second read-only memory means,
said third read-only memory means contains selected data stored at selected addresses, and
said fourth read-only memory means contains data, corresponding to the complements of said selected data stored in said third read-only memory means, stored at addresses corresponding to the complements of said addresses in said third read-only memory means; and means for alternately connecting said first and said second read-only memory means to said first means for transmitting and for alternately connecting said third and said fourth read-only memory means to said second means for transmitting, said means for alternately connecting operates alternately in positive and negative logic in successive processing steps, whereby data from corresponding addresses of said first and third read-only memory means are read out and sensed for anti-valency by the means for monitoring during a first processing step and data from corresponding addresses of said second and fourth read-only memory means are read out and sensed for anti-valency by the means for monitoring during a second processing step.

2. In an improved apparatus for continuously checking the bit patterns read out from memory units, wherein the apparatus has a first means for transmitting digital information forming a digital processing channel, and a second means for transmitting digital information forming a synchronously operated, complementary digital processing channel wherein all data and addresses transmitted therein are complements of corresponding data and addresses transmitted in the first means for transmitting, at least first and second digital switching means connected respectively to the first and second means for transmitting, the first and second switching means being dynamically operated alternately in positive and negative logic in successive processing steps, by utilizing rectangular signal voltages of a given frequency and with a 180 degree phase shift for the two logic values 0 and 1 to define switching variables, and means for monitoring connected to the first and second digital switching means, the means for monitoring continuously senses the valency or anti-valency of output signals generated by the first and second digital switching means based on data values transmitted from the first and second means for transmitting to the first and second digital switching means, and the means for monitoring generates a predetermined alarm signal upon sensing a valency condition, the improvement comprising:

first, second, third and fourth read-only memory means, wherein
said first and second read-only memory means are connected to the first means for transmitting,
said third and fourth read-only memory means are connected to the second means for transmitting,
said second read-only memory means contains selected data stored at selected addresses,
said first read-only memory means contains data corresponding to the complements of said selected data stored in said second read-only memory means, stored at addresses corresponding to the complements of said addresses in said second read-only memory means,
said third read-only memory means contains selected data stored at selected addresses, and
said fourth read-only memory means contains data, corresponding to the complements of said selected data stored in said third read-only memory means, stored at addresses corresponding to the complements of said addresses in said third read-only memory means;
means for alternately connecting said first and said second read-only memory means to said first means for transmitting and for alternately connecting said third and said fourth read-only memory means to said second means for transmitting, said means for alternately connecting operates alternately in positive and negative logic in successive processing steps, whereby data from corresponding addresses of said first and third read-only memories are read out and sensed for anti-valency by the means for monitoring during a first processing step and data from corresponding addresses of said second and fourth read-only memories are read out and sensed for anti-valency by the means for monitoring during a second processing step; and wherein said second and said third read-only memory means contain selected data stored at static addresses, said first and said fourth read-only memory means contain complementary data stored at complementary static addresses, and each of said read-only memory means includes an address input port and a data output port with a plurality of binary bits; and wherein said means for alternately connecting includes:

a first terminal for receiving a binary number corresponding to a dynamic address;

first means for switching connected between said first terminal and said first and second read-only memory means;

said first means for switching is adapted to sense one of the switching variables and to switch through the dynamic address to said address input port of said first read-only memory means only in the case of negative logic to cause said first read-only memory means to read out data stored at said address, and said first means for switching is also adapted to sense said other switching variable and to switch through the dynamic address to said address input port of said second read-only memory means only in the case of positive logic to cause said second read-only memory means to read out data stored at said address;

a second terminal for receiving a binary number corresponding to a dynamic address;

second means for switching connecting between said second terminal and said third and fourth read-only memory means;

said second means for switching is adapted to sense said one switching variable and to switch through the dynamic address to said address input port of said third read-only memory means only in the case of negative logic to cause said third read-only memory means to read out data stored at said address, and said second means for switching is also adapted to sense said other switching variable and to switch through the dynamic address to said address input port of said fourth read-only memory means only in the case of positive logic to cause said fourth read-only memory means to read-out data stored at said address; first and second output lines; and third and fourth means for switching, said third means for switching is connected between said first output line, a first bit of said output port of said first and a first bit of said output port of said second read-only memory means, said third means for switching is adapted to sense said one switching variable and to connect said first bit of said output port of said first read-only memory means to said first output line in the case of positive logic and to connect said first bit of said output port of said second read-only memory means to said first output line in the case of negative logic;

said fourth means for switching is connected between said second output line, a first bit of said output port of said third read-only memory means and a first bit of said output port of said fourth read-only memory means, said fourth means for switching is adapted to sense said other switching variable and to connect said first bit of said output port of said third read-only memory means to said second output line in the case of negative logic and to connect said first bit of said fourth read-only memory means to said second output line in the case of positive logic;

first monitoring control means connected to said first bits of said output ports of said first and third read-only memory means, said first monitoring control means is adapted to continuously sense the anti-valency conditions of said first output bits of said first and third read-only memory means; and second monitoring control means connected to said first bits of said output ports of said second and fourth read-only memory means, said second monitoring control means is adapted to continuously sense the anti-valency conditions of said first output bits of said second and fourth read-only memory means.

3. The improved apparatus according to claim 2 and further comprising a first address generator including a first binary counter connected to the respective corresponding address input ports of said first and second read-only memory means by way of said first means for switching and operated to be cyclically advanced after two processing steps to provide dynamic original addresses to said first read-only memory means during processing steps in positive logic and to said second read-only memory means during processing steps in negative logic, and a second address generator including a second binary counter connected to said third and fourth read-only memory means by way of said second means for switching and operated to be cyclically advanced after two processing steps in order to provide dynamic complementary addresses wherein said second binary counter is connected to said third read-only memory means during processing steps in positive logic and to said fourth read-only memory means during processing steps in negative logic.

4. The improved apparatus according to claim 3, and further comprising third monitoring control means, a fifth means for switching for connecting, in the case of negative logic, said first output bit of said first read-only memory means and the corresponding said first output bit of said fourth read-only memory means to said third monitoring control means, said third monitoring control means is adapted to continuously sense the anti-valency conditions of said first output bits of said first and fourth read-only memory means, first delay means interposed between said first output bit of said first read-only memory means and said fifth means for switching to invert and delay the output information by one processing step, fourth monitoring control means, a sixth means for switching for connecting, in the case of negative logic, said first bit of said second read-only memory means and the corresponding first output bit of said third read-only memory means to said fourth monitoring control means, said fourth monitoring control means is adapted to continuously sense the anti-valency conditions of said first output bits of said second and third read-only memory means; second delay means interposed between said first output bit of said third read-only memory means and said sixth means for switching to invert and delay the output information by one processing step.

5. The improved apparatus according to claim 4, wherein each of said fifth and sixth means for switching includes means for control comparison with respect to a differentiation between negative and positive logic, said means for control comparison including, in each case, a pair of switches each of which comprises a majority decision circuit having three inputs, one of said inputs serving as an information input from the respective output of a read-only memory means, the second of said inputs of one of said majority decision circuits connected to a constant low potential and the second input of the other of said majority decision circuits connected to a constant high potential, the third input of one of said majority decision circuits connected to receive one of said switching variables and the third input of the other of said majority decision circuits connected to receive the other switching variable.

6. The improved apparatus according to claim 4, wherein each of said delay means comprises a master-slave memory element having two inputs and an output and operating in accordance with the Boolean equation $$AGt1 = E10 \cdot E20 + AGto \cdot (E10 + E20)$$

for switching variables represented by the rectangular signal voltages, said two inputs corresponding to the equation elements $E10$ and $E20$ connected to each other and serving as an information input.

* * * * *